United States Patent
Speakman et al.

(10) Patent No.: US 6,849,308 B1
(45) Date of Patent: Feb. 1, 2005

(54) METHOD OF FORMING A MASKING PATTERN ON A SURFACE

(76) Inventors: Stuart Speakman, 7 Chapel Drive, Little Waltham, Chelmsford, Essex (GB), CM3 3LW; Eric Bresler, 6 Bliss Way, Cherry Hinton, Cambridge (GB), CB1 9YE; Ian Andrew Gardner, 15 Whitegate Close, Swavesey, Cambridge (GB), CB4 5TT ( * ) Notice: Subject to any disclaimer, the term of this patent is extended or adjusted under 35 U.S.C. 154(b) by 0 days.

(21) Appl. No.: 09/937,979

(22) PCT Filed: May 30, 2000

(86) PCT No.: PCT/GB00/02077
§ 371 (c)(1),
(2), (4) Date: Jan. 23, 2002

(87) PCT Pub. No.: WO01/11426
PCT Pub. Date: Feb. 15, 2001

(30) Foreign Application Priority Data

May 27, 1999 (GB) .............................................. 9912437
Mar. 10, 2000 (GB) .............................................. 0005929

(51) Int. Cl.[7] .............................. B05D 1/02; B05D 3/06
(52) U.S. Cl. ....................... 427/595; 427/553; 427/512; 427/596; 427/422
(58) Field of Search ................................ 427/595, 457, 427/458, 466, 470, 475, 478, 479, 480, 485, 534, 535, 555, 553, 512, 596, 597, 422

(56) References Cited

U.S. PATENT DOCUMENTS

| | | | |
|---|---|---|---|
| 3,795,443 A | * 3/1974 | Heine-Geldern et al. | ...... 355/10 |
| 5,132,248 A | 7/1992 | Drummond et al. | |
| 5,637,426 A | 6/1997 | Uchikawa | |
| 5,810,988 A | * 9/1998 | Smith, Jr. et al. | ........... 204/666 |
| 6,599,582 B2 | * 7/2003 | Kiguchi et al. | ............. 427/466 |
| 2002/0164432 A1 | * 11/2002 | Hofmeister | ................. 427/421 |

FOREIGN PATENT DOCUMENTS

| | | |
|---|---|---|
| DE | 3728337 A | 3/1989 |
| DE | 3740149 A | 8/1989 |
| DE | 42 28 344 A1 * | 3/1995 |
| DE | 43 29 338 A1 * | 3/1995 |
| EP | 0 641 648 A1 * | 3/1995 |
| EP | 0 776 763 A1 * | 6/1997 |
| GB | 2 330 331 A | 4/1999 |
| GB | 2 330 451 A | 4/1999 |
| JP | 03-65345 | 3/1991 |
| JP | 080240803 A | 9/1996 |
| JP | 090219019 A | 8/1997 |
| WO | WO 95/23244 A1 | 8/1995 |
| WO | WO 97/48557 | 12/1997 |
| WO | WO 99/19900 A2 | 4/1999 |
| WO | WO 99/60829 A2 | 11/1999 |

OTHER PUBLICATIONS

Translation of DE 4228 344A1 by Dr. Herbert Feld et al, Mar. 1994.*
Translation of DE 43,29 338A1 to Nishikawa, Mar. 1995.*
Lerner,etal, ed. *Encyclopedia of Physics*, 2$^{nd}$ed., VCH Publishers,Inc., New York, except p. 285–288 "Electromagnetic Radiation", 1991 No month.*
Translation of DE 42 28 344 A1 to Feld etal, Mar. 1995.*
International Search Report from Applications GB 9912437.2 and GB 0005929.5.
Notice of Opposition in EP Patent 1 163 552 application No. 00935358.2 Aug. 2003.

* cited by examiner

*Primary Examiner*—Marianne Padgett
(74) *Attorney, Agent, or Firm*—Wolf, Greenfield & Sacks, P.C.

(57) ABSTRACT

A method of forming a masking pattern on a surface using the technique of droplet ejection to deposit droplets of deposition material, said method comprising depositing a plurality of droplets on said surface to form such a pattern comprising multiple discrete or coalesced extended portions.

77 Claims, 17 Drawing Sheets

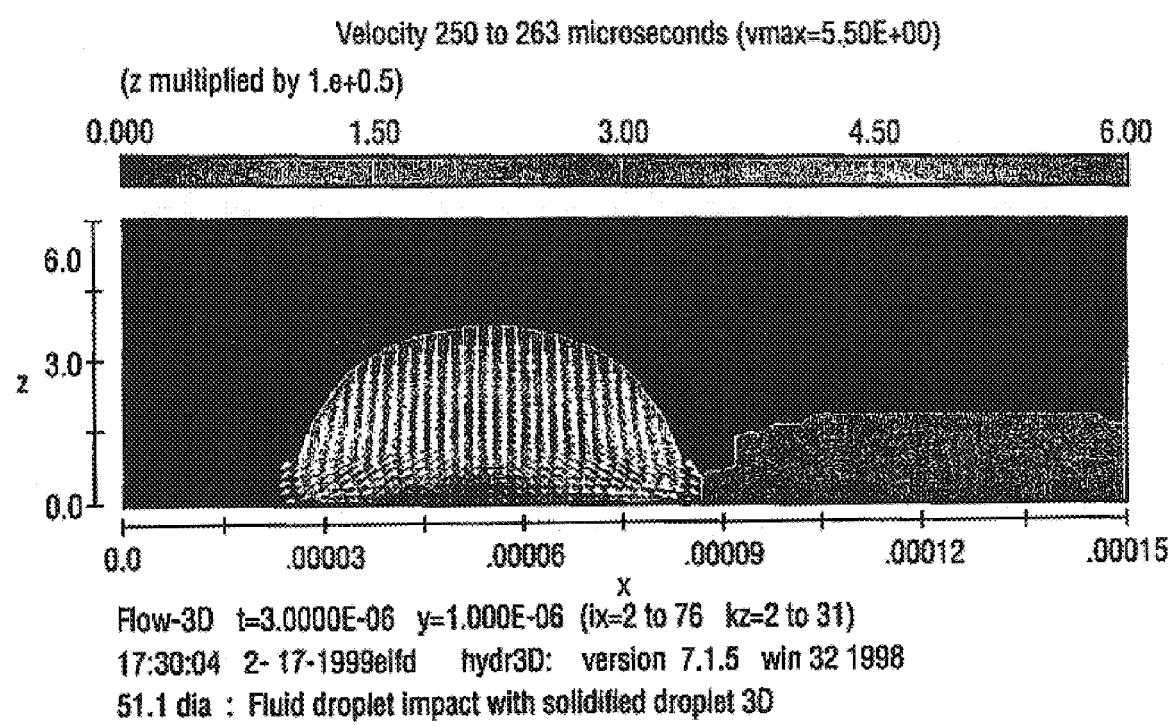

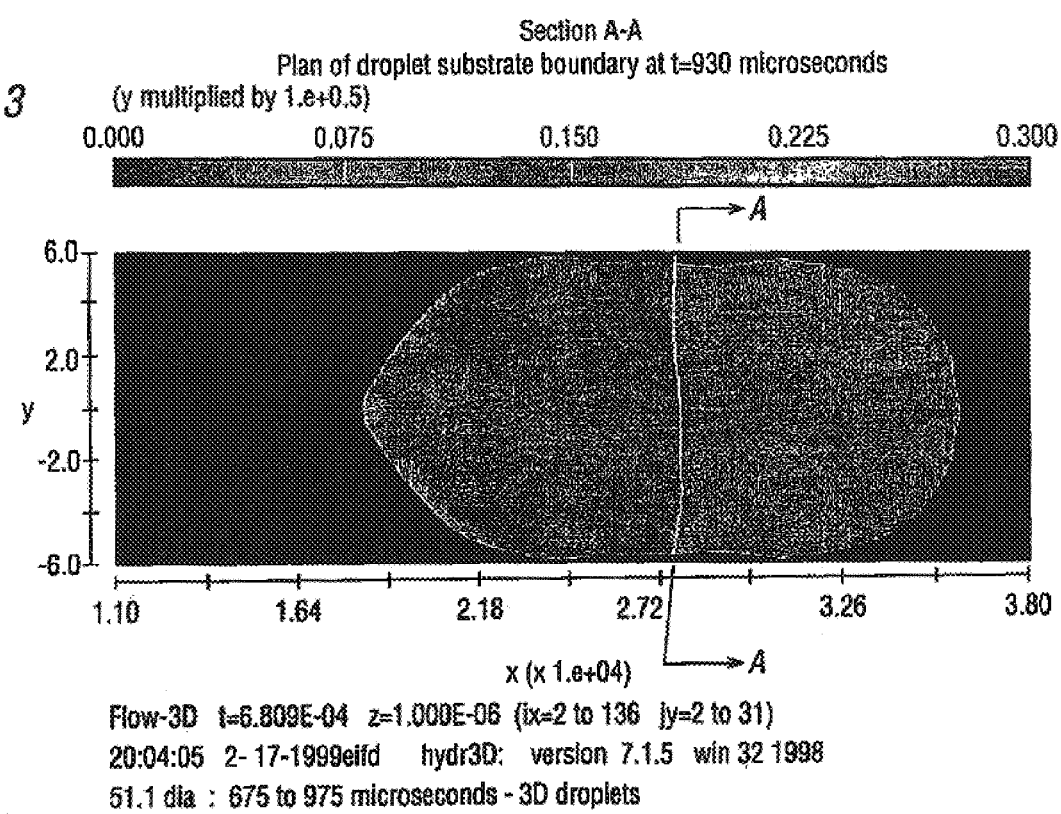

FIG. 7

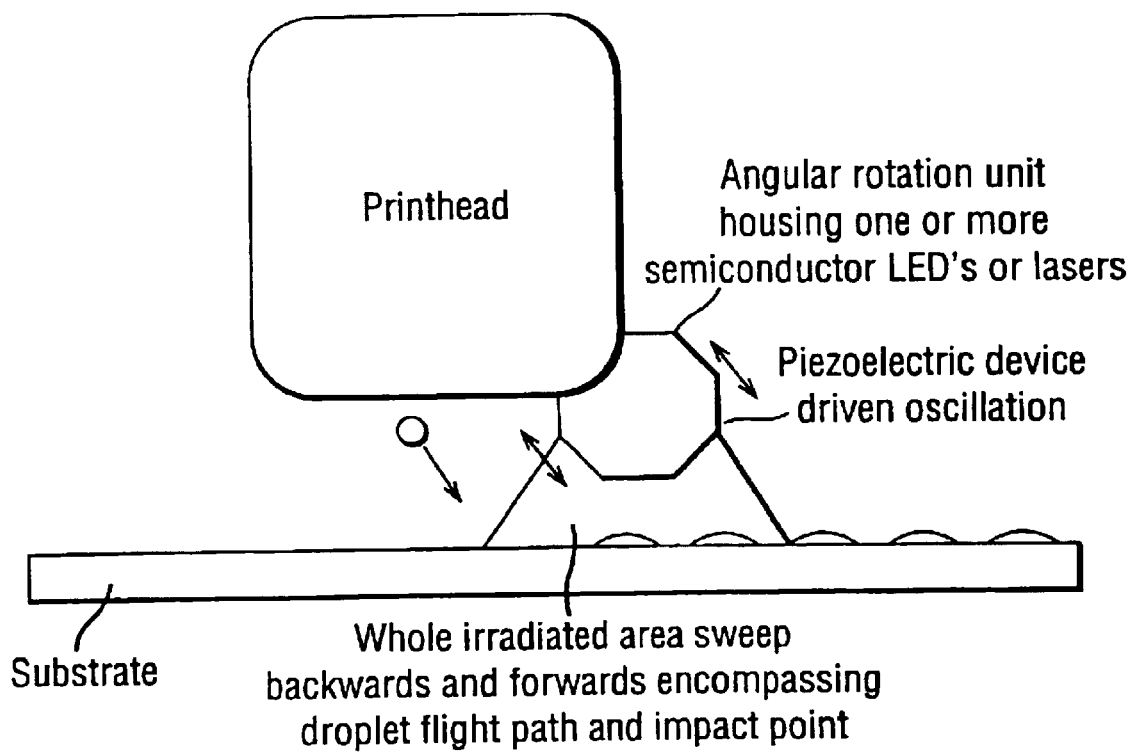

Printhead

Angular rotation unit housing one or more semiconductor LED's or lasers

Piezoelectric device driven oscillation

Substrate

Whole irradiated area sweep backwards and forwards encompassing droplet flight path and impact point

FIG. 8

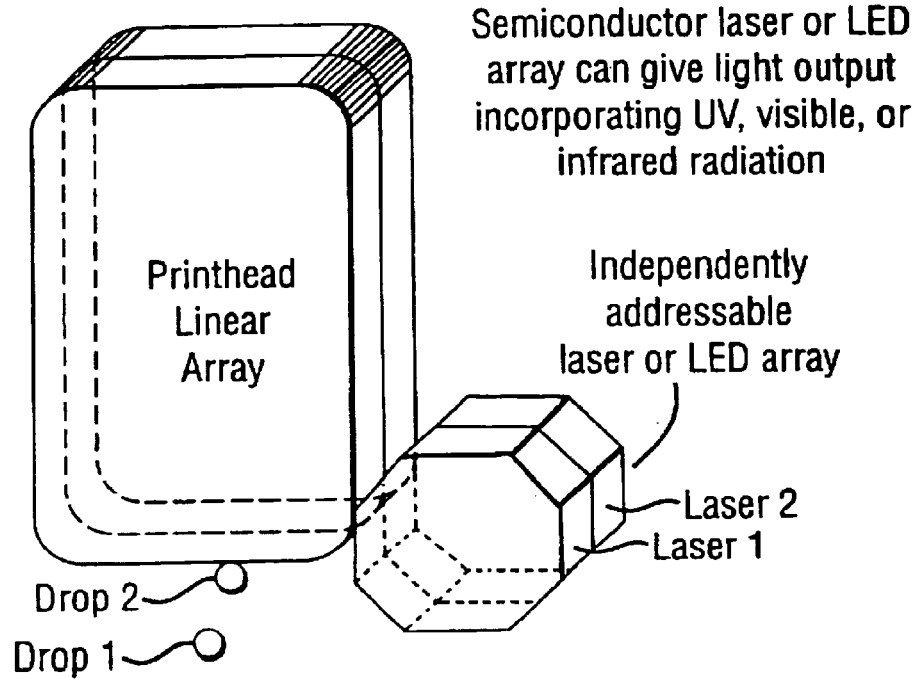

Semiconductor laser or LED array can give light output incorporating UV, visible, or infrared radiation Printhead Linear Array Independently addressable laser or LED array Laser 2
Laser 1

Drop 2
Drop 1

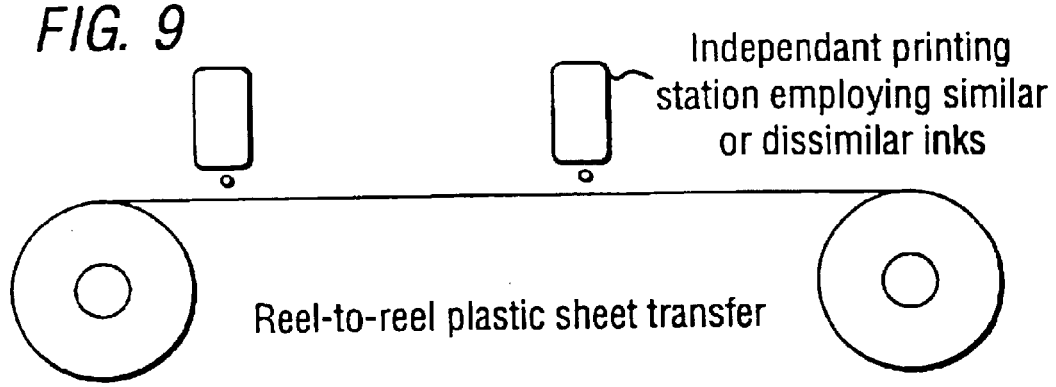

FIG. 9 — Independant printing station employing similar or dissimilar inks; Reel-to-reel plastic sheet transfer

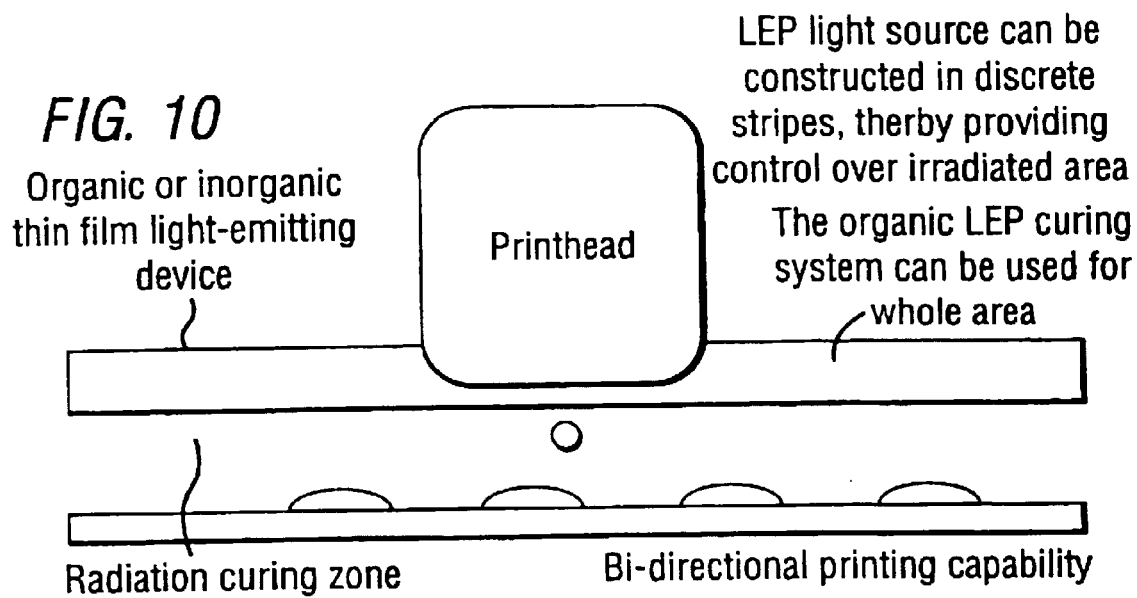

FIG. 10 — Organic or inorganic thin film light-emitting device; Printhead; LEP light source can be constructed in discrete stripes, therby providing control over irradiated area; The organic LEP curing system can be used for whole area; Radiation curing zone; Bi-directional printing capability

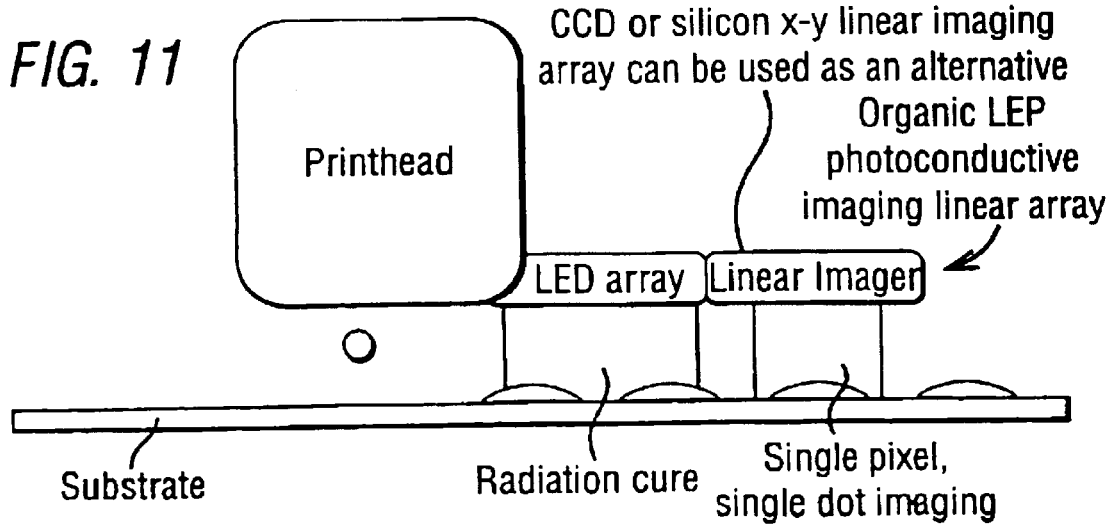

FIG. 11 — Printhead; CCD or silicon x-y linear imaging array can be used as an alternative; Organic LEP photoconductive imaging linear array; LED array; Linear Imager; Substrate; Radiation cure; Single pixel, single dot imaging

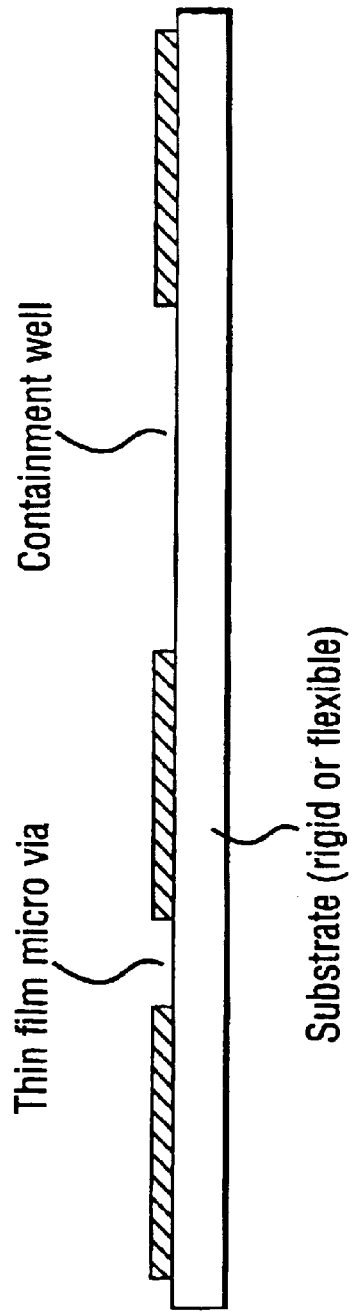
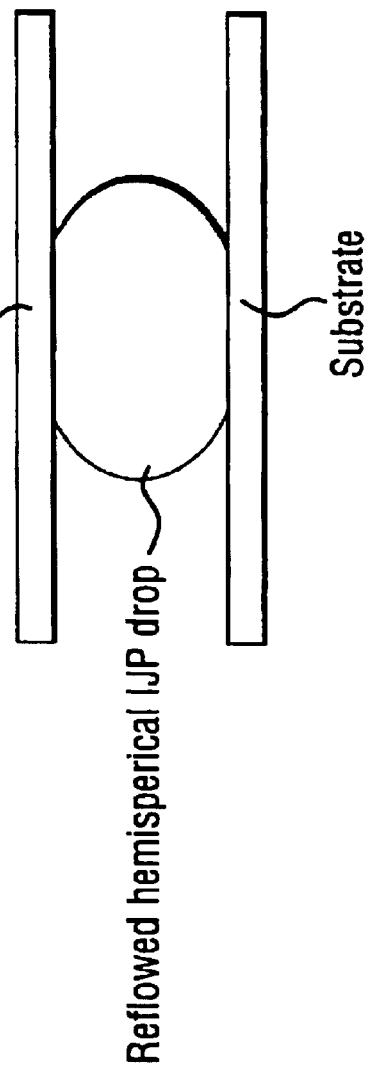

METHOD OF FORMING A MASKING PATTERN ON A SURFACE

The present invention relates to a method of forming a mask pattern on a surface. In one preferred embodiment, the present invention provides a method of drop-on-demand printing of a relief pattern on a surface using computer generated images files (i.e., Gerber input to bitmap output).

In a wide variety of inorganic or organic-based microelectronic and opto-electronic device and circuit manufacturing applications it is necessary to pattern one or more materials that comprise the device or circuit being fabricated. The pattern being formed can be for one of many reasons, including:

Etch mask (for wet, dry, electrochemical, etc.)
Selective area deposition mask (lift-off, air-bridge [2-level process], electroplating, electrophoresis, etc.)
Containment well (for phosphors, liquid crystals, light emitting polymers, etc.)
Dielectric micro-via promoting multi-level metal interconnections
Metal conductor cross-over resistor-capacitor nodal network
2-D and 3-D membranes (static or removable)
Piece part interlevel spacer (providing controlled gap dimension between piece parts)
Piece part reflowable thermosetting adhesive (localised adhesive for bonding pieces parts)

Such patterned features could be removed or left in place after serving the required function.

The most popular method of providing a surface relief structure is photolithography. This requires the use of a photosensitive material that is applied to a surface as a whole area coating (spin-casting or dipping) or as a whole area sheet (lamination). The material is applied in a light controlled laboratory in order to ensure that the photosensitive material is not pre-exposed prior to introducing the required pattern mask in front of the coated wafer. The patterning mask can be either a contact mask, a proximity mask, or a projection mask. In all cases the mask much be manufactured as a discrete unit to a high precision and must be carefully protected against damage or dust/particulate collection. Once the mask is put in place then a lamp, of a radiation matched to the photoinitiator used in the photosensitive material, can be used to expose the substrate coating in those areas not protected by the mask. Depending upon the photosensitive material type employed the pattern transfer achieved can be either positive or negative with respect to the mask. After exposure the photosensitive material must be exposed to a developing chemical that modifies the chemistry of the coating in such a manner as to permit the untreated material to be washed away in a water-based dip bath or conveyor shower/spray.

Although spin-cast, dip, or sheet lamination photolithographic methods of achieving a surface relief pattern are successful they do have a number of problems, namely:

Material wastage (because whole area technique)
Selective area 3-D patterning is extremely difficult and time consuming
Chemistry used in photosensitive material has high toxicity rating
Disposability of large volumes of toxic and developing chemicals
Simple pattern is still a multiple step process of:
Photoresist coating;
Mask alignment;
Radiation exposure;
Mask removal;
Pattern development;
Excess material rinse removal; and
Substrate drying.

It is possible to address one or more of these problems by introducing further processes that can provide a patterned relief structure on a surface, including stencilling (screen printing), microdot transfer (stamping), and laser writing-etching (includes ablation scribing and direct-write photolithography equivalent imaging). Each technique has its merits and limitations which tend to be driven of the intended application, namely:

Speed of pattern generation
Relief pattern thickness
Controlled etch capability
Cost of process
Ease of use of process However, not all of the problems cited above can be addressed by any one process.

The preferred embodiments of the present invention seeks to solve these and other problems.

In one aspect, the present invention provides a method of forming a masking pattern on a surface, said method comprising the steps of:

depositing using droplet deposition apparatus a plurality of droplets on to a surface to form a masking pattern, said droplets passing through an operating zone located between the deposition apparatus and surface; and controlling the local environment of the operating zone so as to control the formation of the masking pattern on the surface.

As discussed in more detail below, control of the local environment only of the operating zone has been found to have a significant influence on the formation of the masking pattern on the surface. Preferably, formation of the masking pattern is controlled so that the masking pattern has predetermined structural properties.

A preferred technique is drop-on-demand printing, in which individual droplets, or a continuous stream of droplets, are deposited on the surface to form the masking pattern. Examples of drop-on-demand printing include ink jet methods based on piezoelectric, piezo resistive, relaxor and bubble-jet induced pressure generation for ejecting a droplet from a printhead.

The masking pattern can be formed from a wide variety of different materials, depending on the purpose of the masking pattern. For example, the pattern may be formed from at least one of an alkyd, acrylic, phenolic, chlorinated rubber, epoxy, polyester, polyurethane, polyvinyl, silicone, fluorocarbon, polyimide, polyamide, and polystrene. The pattern may be formed from one of metallic, dielectric, magnetic, light emitting, light absorbing, light transmitting, conducting, insulating, semiconducting or superconducting material. The deposition material may be 100% solid polymer.

The deposition material may be an organically modified ceramic.

The deposition material may be in the form of a solution, or solution-gelation. The solvent may be one of water, a lower alcohol, ethylene glycol, acetone, hexane, benzene, chlorobenzene, toluene, para-xylene and methylene chloride.

Preferably, the operating zone extends from the deposition apparatus to the surface. However, the operating zone may extend only partially between the deposition apparatus and the surface.

In a preferred embodiment, relative movement is effected between the deposition apparatus and the surface so as to move said operating zone across the surface during formation of the masking pattern.

Preferably, the local environment of the operating zone is controlled for one or more of at least the following reasons:
  (i) so as to control the coalescence of the droplets on the surface;
  (ii) so as to control the spreading of the droplets on the surface;
  (iii) so as to control placement of the droplets on the surface; and
  (iv) so as to avoid contamination of the droplets.

Preferably, the local temperature of the operating zone is controlled so as to control the rate of solidification of the droplets on the surface.

Preferably, the local atmosphere of the operating zone is controlled. Such localised atmosphere control can provide a much cheaper means of controlling the required deposition characteristics as opposed to atmosphere control associated with the whole area to printed on. This zone can in one embodiment be achieved by surrounding the printhead with a containment surface, such as, for example, a bellows-type structure that provides a positive pressure of air or a specified inert or reactive gas injection (gas being heated or cooled). A soft vacuum can also be supported within the bellows, making use of a dry vacuum pumping arrangement.

Thus, in one preferred arrangement an at least partial vacuum is generated in the operating zone so as to substantially avoid contamination of the droplets during passage from the deposition apparatus to the surface. A pressure differential extending between the deposition apparatus and the surface may be established in the operating zone. Alternatively, or additionally, an inert or reactive gas may be introduced into the operating zone during droplet deposition.

In a preferred embodiment the operating zone is locally exposed to electromagnetic radiation so as to control coalescence of droplets on the surface, thereby controlling the solidity of the masking pattern. The duration of the local exposure of the operating zone to electromagnetic radiation may be controlled so as to control the spreading of the droplets on the surface, thereby controlling the resultant shape of the masking pattern. Alternatively, or additionally, the intensity of electromagnetic radiation is controlled so as to control the spreading of the droplets on the surface, thereby controlling the resultant shape of the masking pattern.

The droplets of deposition material may be radiation cured prior to and/or after deposition in the surface. In one embodiment, the radiation curing has a threshold energy of $\geq 1$ mJ.cm$^{-2}$.

For instance, linewidth and profile control of the masking pattern may be achieved by controlling the time after impact that the deposited material is exposed to the radiation curing. The time period is preferably in the range from 1 to 2000 ms, more preferably in the range from 50 to 300 ms.

Exposure to a critical radiation has been found to promote a change in the liquid material rheology thereby affecting the rate of spreading of a droplet over the surface and the rate and degree of coalescence with adjacent droplets. Such control of the droplet coalescence and curing can enable a straight-edged, parallel-sided masking pattern to be formed in a time domain from 0 to 100 milliseconds after droplet deposition. Computational fluid dynamic (CFD) modelling has provided evidence for the impact dynamics and surface wetting behaviour of droplets in the time domain up to and during coalescence. The droplet volume, diameter, and impact energy, coupled with the droplet ejection time (hence impact spacing) have been found to contribute directly to the coalescence behaviour.

The specifics of the use of the masking pattern dictate the rate of droplet ejection and the rate of surface transfer leading to a droplet centre-to-centre spacing. Adjustments to the operating parameters can permit direct control of the droplet-to-droplet coalescence time domain.

To achieve a dynamic range in linewidth, the surface wetting and rate of solidification of a droplet on the surface are preferably controlled. This may be achieved by controlling the surface energy of the surface and the properties of the material used in the deposition process. The surface energy control can be effected by many methods including abrasion, polishing, ozone treatment, plasma exposure, and coating with a non-wetting material. The fluid solidification control can be achieved by chemical design of the fluid and by the type, degree, and timing of the radiation curing.

The radiation curing can be provided by any suitable means.

To provide the ability to select the time and location relative to the droplet impact zone when the radiation is allowed to interact with the deposited feature, the light output from a radiation source may be transferred to the printhead using a fibre-optic light-pipe arrangement. Multiple fibre-optic light-pipes can be employed that are either bundled together or are combined in a unit that provides a line output conversion.

The electromagnetic radiation may be one of ultra violet, Visible, Infrared radiation, Microwaves, and $\alpha$-particles). In order to achieve high speed curing it is preferred that both the photoinitiator chemistry of the deposition material and the incident irradiation intensity of the radiation source used to cure the material are controlled, together with the time of exposure to the radiation. The radiation curing may be provided in multiple-wavelengths of radiation co-incident sequentially or in parallel on the deposited droplets.

The radiation source may comprise at least one light emitting diode (LED). The or each LED may be inorganic or organic, and may be based on SiC, InGaN or a PPV derivative. The radiation source may comprise a set of discrete LEDs. Such a source can comprise a number of discrete LEDs that are butted together to form a independently addressable linear or area array of LEDs. Plastic encapsulating packaging can be removed to reduce the bulk of the array to facilitate closer integration to the deposition printhead.

Alternatively, the radiation source may comprise at least one semiconductor quantum-well solid state laser. The or each laser may be inorganic or organic, and may be based on SiC, InGaN or a PPV derivative. The radiation source may comprise a set of discrete lasers. Such a source may comprise an independently addressable array of semiconductor quantum-well stack solid-state lasers. The lasers may be manufactured on a single crystal wafer. The wafer can be diced to produce a line of lasers which can be directly bonded to the printhead or to an angular rotatable housing to facilitate curing of the droplet in-flight, on impact, and on spreading over the surface. Alternatively, the lasers may be manufactured on a flexible plastic sheet.

The radiation source may comprise at least one light emitting polymer (LEP), which may be employed in a strip light or a whole area illumination device. The LEP may be a thin film device. The radiation curing can be achieved as a large area process by making use of thin film inorganic or organic light emitting materials. The thin film device design defines the wavelength band that will be emitted by the device. The emission can be tuned to suit a specific wavelength or wavelengths. Discrete stripes or bands of wavelength can be achieved in the device manufacture. Stripe or band focusing or defocusing can be achieved with a lenticular lens arrangement. The lenticular lens can also be deposited using drop-on-demand techniques. In one preferred embodiment, the LEP emits a white light which is filtered to select a wavelength for curing or illumination of the deposited masking pattern.

The present invention can provide a high throughput etch mask printing system by utilising reel-to-reel and/or robotic substrate transfer methods. For example, multiple sets of printheads may be used so as to permit a multiplicity of discrete work stations to be operational along the open length of plastic sheeting retained between the two tensioned "feed" and "accept" drums. Each printhead may deposit the same or respective different deposition materials.

Preferably, fiducial alignment marks are generated. Serialising coding may be deposited on individual substrates (for example, for printed circuit boards for wet etching). This can be achieved by using drop-on-demand printing methods using coloured or transparent inks.

The present invention may utilise dynamic imaging of the deposited masking pattern. Such imaging may be provided by a linear imaging device integrated directly on to the printhead. The real-time imaging can achieved by integrating an imaging array, such as a charge-coupled device (CCD) onto both sides of the printhead assembly, thereby permitting bi-directional print imaging. The real-time imaging can be achieved using inorganic imaging devices such as CCD's or silicon x-y addressable photodiode array's or by thin film organic photoconductive pixel array's (photodiodes).

In order to enhance processing yield, pattern recognition and software-based overlay comparison may be employed, for example, using a large area organic photoconductive array. This can enable a complete substrate to be imaged at one time without recourse to expensive lens arrangements. The organic photodiode area array preferably has a pixel resolution compatible with the finest feature size to be imaged. The image is preferably on a 1:1 correspondence, making the software-based pattern recognition easier and faster.

The present invention preferably employs a bimorph or other electronically driven electromagnetic radiation shutter for selectively covering the nozzle aperture of the printhead. The shutter assembly is a micromachined structure. The shutter comprises means for cleaning the nozzle surface. Thus, in another aspect the present invention provides droplet deposition apparatus comprising a deposition chamber, a nozzle in fluid communication with the deposition chamber and a nozzle shutter for selectively covering the nozzle aperture, the shutter including means for cleaning the surface of the nozzle.

In one preferred embodiment, the cleaning means comprises a set of thin/thick film wiper blades for cleaning the nozzle surface. The apparatus may also comprise a set of fluid ducts to assist the flow of residual ink from the wiper blades to a catchment reservoir located at either end of the shutter assembly. A vacuum suction tube may be located in the reservoir to periodically empty the retained fluid/ink.

The in-situ environmental and radiation shutter assembly can also act as a real-time pulsed plasma electrode that provides surface pre-treatment adjacent to droplet landing zone and/or as a printhead vacuum priming unit.

The surface of the wiper blade can be locally hardened to provide an improved cleaning action and wear resistance. The blade is preferably hardened by exposing the surface of the shutter to a beam of high energy ions (ion implantation or plasma immersion implantation).

The method may employ a number of droplet firing waveforms and sequences, catering for variable speed radiation curing printing. Specific drive waveform sequences can be used depending on the type of masking pattern.

A surface pre-treatment may be performed, for example, in-situ and/or prior to deposition of the masking pattern. The surface pre-treatment may be performed by a localised ozone, radiation exposure, acidic or alkali jetting from a spray head or an ink jet printhead, or solvent dispensing from a spray head or an ink jet printhead, including a means of drying.

Real-time height positioning of an ink jet printhead may be performed during the deposition of the masking layer. This positioning may be performed using a bimorph or cantilever-type or servo-drive positioning transducer that permits printhead movement in the z-axis. Height adjustment is preferably in the range from 50 to 2000 microns, more preferably in the range from 0.75 to 1.25 mm. Positioning transducers may be positioned at either end of printhead in order to ensure parallel displacement of the printhead. Such real-time positioning may be a direct result of feedback signal from electro-optical (laser [range finder principle] or LED in conjunction with a phototransistor or photocell pair) or capacitive, or inductive sensing element. Such height control can facilitate direct fluid contact transfer.

The present invention can enable wide format printing by utilising a printhead enclosure that can house a multiple of printheads. For example, a series of printheads may be butted together with a common nozzle format. This can ensure that although the number of nozzles is increased the resultant parallel-sided pattern is not affected. The butting error could compromise such print, hence the need to integrate a common nozzle plate. The butter printhead may be aligned in the x-y-z axes by utilising piezoelectric positioning of a He-Ne sighting laser assembly that can be removed once the alignment has been completed.

In order to optimise the mask pattern linewidth, the formulation of the deposition material may be controlled. Properties of the deposition material, such as the glass transition temperature, $T_g$, can affect the hardness and temperature stability of the deposition material. Changes in the bulk-to-surface photoinitiator ratio can also affect the rate of curing. Optimum operation occurs for the range 1: to 4:1 (surface:bulk).

A close-coupled, lower temperature, microwave initiated gaseous discharge radiation source may be used to promote large area polymer cross-linking. Lower surface has had fabricated in it a surface relief pattern that permits the discharge induced photo species to couple-out on to the substrate surface and thereby irradiate the mask material. The surface relief required to extract the plasma discharge photons of the desired wavelength (gas specific) can be a dispersion structure such as diffuser, dot matrix, or moth-eyed lens matrix. A preferred embodiment makes use of lenticular lens type array, where the nearly rectangular cross-sectioned (variable angled wall geometry of angle $\leq 90°$) projection width, height, and wall slope affect the efficiency of coupling for the wavelength of light specified.

A specified nozzle plate geometry may be used to affect the placement control of the drops ejected from the nozzle array. If shearing action is employed (i.e., Xaar XJ series printhead) then a nozzle stagger is preferably defined in the nozzle plate to permit straight text printing. In order to obtain a coalescence of drops, leading to a well defined line, it is necessary to vary the drop spacing by operating the printhead outside of standard parameter range.

The masking pattern may be an electrode surface solder reflow resistant mask pattern. In this instance the method useful to form the solder mask is similar to that used to form the etch mask defined above, with the difference being that the choice of ink formulation must reflect the higher temperature limits applied to the solder dip coating and thermal wave solder reflow processes. Soluble materials that can be used as the solder mask include silicone, polyimide, PTFE, and epoxy.

The masking pattern may be a 3-D etch mask. A number of device fabrication applications require the production of a variable build height or etch depth feature. It is possible to use the droplet deposition process to define such a feature using either multiple droplets solidified at a specific site or multiple passes of a pattern where the pattern being deposited can be different each time.

In one preferred embodiment, the masking pattern is a dry etch resistant, inorganic etch mask. Etch masks may be formed based on inorganic or mixed organic-inorganic fluid systems. In such cases the properties of the fluid and chemically stability with respect to the printhead materials and nozzle-non-wetting coating still apply. An organic-inorganic fluid (ormocer—organically modified ceramic, sol-gel, metallo-organic, etc.) can still employ radiation curing, such as UV. The masking pattern may be an electroless or electrolytic plating bath resistant, etch mask pattern. The method of printing is the same as for printed wiring board etch mask printing. The difference is in the choice of materials used and the need to construct a mask pattern that is 3-dimensional in nature. Typical materials include epoxies, polycarbonates, silicone, PTFE, polychlorotrifluorethylene, polyimide, polyisoprene, and polypropylenepolystrene, etc.

The masking pattern may be an additive plating etch mask.

The masking pattern may be a high resolution etch mask. High resolution has a different meaning dependent upon the application being served. For the purpose of this disclosure high resolution means a feature size of less than 10 $\mu$m [microns].

The masking pattern may be an electrically conducting masking layer. Such a masking layer can be left in place after use, as in the seed layer for electroless/electrolytic plating of an electrode pattern. The masking layer can be carbon-based or metal acetate-based (i.e., palladium), in order to effect a specific conductivity and chemical interfacial reaction prior to plating up with the metal of choice.

The masking pattern may be a decorative surface etch mask. The decorative surface may be based on the properties of the ink(s) being used to form the surface relief pattern. Such a system could be used as a security device due to the unique nature of the particulate distribution in the solid that can be imaged and recorded as a secure signature.

The present invention may utilise a UV (or alternate energy/radiation) line source in the deposition of an etch mask pattern. Such a line source can provide a uniform area of radiation (UV-visible-IR-electron) exposure across the width of the selected printhead. The line source construction in one preferred embodiment makes use of a fibre-optic bundle that is fanned-out to give a single line of fibres of individual diameter in the range 0.25 to 1 mm. The line of fibres are in direct contact and are secured to a polyimide sheet backing material that provides some degree of rigidity and ease of handling.

The present invention also extends to a method of forming a circuit pattern on a circuit board using the technique of droplet ejection to deposit droplets of deposition material, said method comprising depositing a plurality of droplets on said circuit board to at least partially fill via holes formed in the circuit board. Such a method can be performed in two different ways, namely a plated hole in-fill or surface tension driven coating.

The in-fill process makes use of a multiplicity of droplets that under the action of capillary forces causes the droplets to fill the via hole. UV curing solidifies the deposited droplets to form a solid plug.

Surface tension driven coating process requires that the drop size be greater than the size of the via hole to be filled.

Preferably, the method includes the step of subsequently at least partially removing the masking pattern. The removal process can be either dry or wet. The dry process makes use of a plasma based on a variety of gas chemistries including argon, oxygen, argon-oxygen mix, $CF_4$-oxygen mix, argon-water vapour, etc. (Inert gas rare-earth series; Reactive gas being hydrogenated, oxygenated, chlorinated, fluorinated, etc.). The wet process makes use of both aqueous and non-aqueous solvent systems. Aqueous based chemical etchants are primarily caustic-based [typical process being spray injection via roller feed of 5% NaOH in $H_2O$ at 30° C.]. The non-aqueous solvent used to remove the acrylate mask include:

Chloroform (dissolution action)

Dichloromethane (swelling and dissolution action—quick removal)

Tetrachloromethane (dissolution action)

Chlorobenzene (swelling action)

1,1,2-trichloroethane (dissolution action)

N-methyl pyrrolidinone [NMP] (swelling action—slow process)

The method may utilize a duel printhead arrangement with a common integrated radiation curing source. This arrangement may have a radiation source located at the outer edges and the centre of the dual back-to-back printhead arrangement. This permits the printhead to print in a bi-directional mode, providing the same degree of radiation exposure irrespective of the forward or reverse direction print.

The masking pattern may be formed based on chemical attachment transfer. Chemical attachment can be through chirality or via a hydrophilic-type reaction on a catalysed surface.

The present invention can be utilised to form a single panel printed wiring board (PWB) back-to-front auto-registered etch mask printing process. The process can make use of two facing printheads or butted linear arrays of printheads, that have been aligned relative to one another using for example a He-Ne laser beam and a silicon diode photodetector.

The masking pattern may be a near vertical-walled mask pattern. Computational fluid dynamic modelling (based on FlowScience Inc., Flow3D modelling software) of ink jet printhead ejected drop interaction with solid surfaces has suggested that it is possible to create a single dot with a sidewall geometry very close to vertical. The drop spacing and the solidification state of the previous drop, coupled with the impact velocity of the drop and the ink viscosity, affect the rate of coalescence to form a line. In order for the line to have a vertical sidewall profile it is essential that the coalescence process occurs in the time it takes for the drop material to spread-out to the width of the solidified drop (i.e., in a time $\leq$ to 10 $\mu$seconds).

The masking pattern may be an ion implantation mask. The objective of such a masking material is to shield the surface under the mask from a high energy ion beam. The energy range of interest spans 10 eV to 50 MeV. The masking layer thickness will depend upon the energy of the irradiating beam. For the highest energy the anticipated mask thickness will be $\leq$10 $\mu$m.

The masking pattern may be a confinement well mask, such as that used in the manufacture of a single or multiple colour light-emitting polymer displays (see FIG. 26). Other such display devices that could make use of such a containment well include inorganic lanthanide dyes or organic small molecule dye structures.

The present invention also provides a method of forming a spacer pattern on a surface, said method comprising the steps of:

depositing using droplet deposition apparatus a plurality of droplets on to a surface to form a spacer pattern, said droplets passing through an operating zone located between the deposition apparatus and the surface; and during droplet deposition, controlling the local environment of the operating zone so as to control the formation of the spacer pattern on the surface.

A stand-off spacer is typically used to separate, by a known and precise height, two parts of a flat panel display device. An example is the use of a spacer material, of a known conductivity and secondary electron emissivity, for use in a vacuum-based field emission display. A further example is the separation well structure used in a liquid crystal display. The well structure contains the liquid crystal that can be either ink jet printed or vacuum impregnated in order to effect filling of the well.

The present invention also extends to a method of forming a masking pattern using an all-dry, charged toner, phototransfer process. Thus, the present invention also provides a method of forming a relief pattern on a surface, said method comprising the steps of:

selectively irradiating a charged roller to selectively remove the charge on portions of the roller;

depositing using droplet deposition apparatus a plurality of droplets on to the charged portions of the roller, said droplets passing through an operating zone located between the deposition apparatus and the roller;

during droplet deposition, controlling the local environment of the operating zone so as to control the structure of the pattern formed on the roller; and transferring the depositioned material from the roller on to a surface to form a relief pattern on said surface.

This is an adaptation of photocopying in that the toner is a nano- or microcapsule/particulate/bead system that provides the necessary dimension and material properties for charge accumulation on the toner and particle transfer to the photoconductor and substrate to be patterned. Alternate process makes use of a toner can be processed using in-situ rapid thermal/infrared radiation (pulsed or continuous irradiation) processing means to reflow the microcapsules/particles/beads in order to effect material coalescence. By way of example, consider that the toner microcapsules/particles are in fact solid beads of a low temperature (<200° C.) thermoplastic. The charged particles undergo melting as the temperature is introduced. The degree of melting being sufficient to permit coalescence without excessive surface wetting (reflow). Removal of heat permits the thermoplastic to resolidify, thus forming the required etch mask pattern. It is anticipated that hollow capsules could be used that contain a specific material (i.e., polymer, inorganic, etc.).

Preferred features of the present invention will now be described, by way of example only, with reference to the accompanying drawings, in which:

FIG. 1 is a captured image from an animation sequence resulting from a computational fluid dynamic model of the spreading behaviour of a typical masking ink on a surface whose surface energy is equivalent to that observed for a typical printed wiring board material. Note that the droplet spacing, surface energy interaction, and time before exposure to critical threshold radiation energy dictate the line width and edge quality achieved.

FIG. 2[a–b] are captured images from an animation sequence resulting from a computational fluid dynamic model of the interaction of two ink jet droplets in the 2D vertical plane, covering the time interval from impact out to 1 millisecond.

FIG. 3 is a captured image from an animation sequence resulting from a computational fluid dynamic model of the interaction of two ink jet droplets in the 2D horizontal plane, covering the time interval from impact out to 1 millisecond.

Figure 5A:
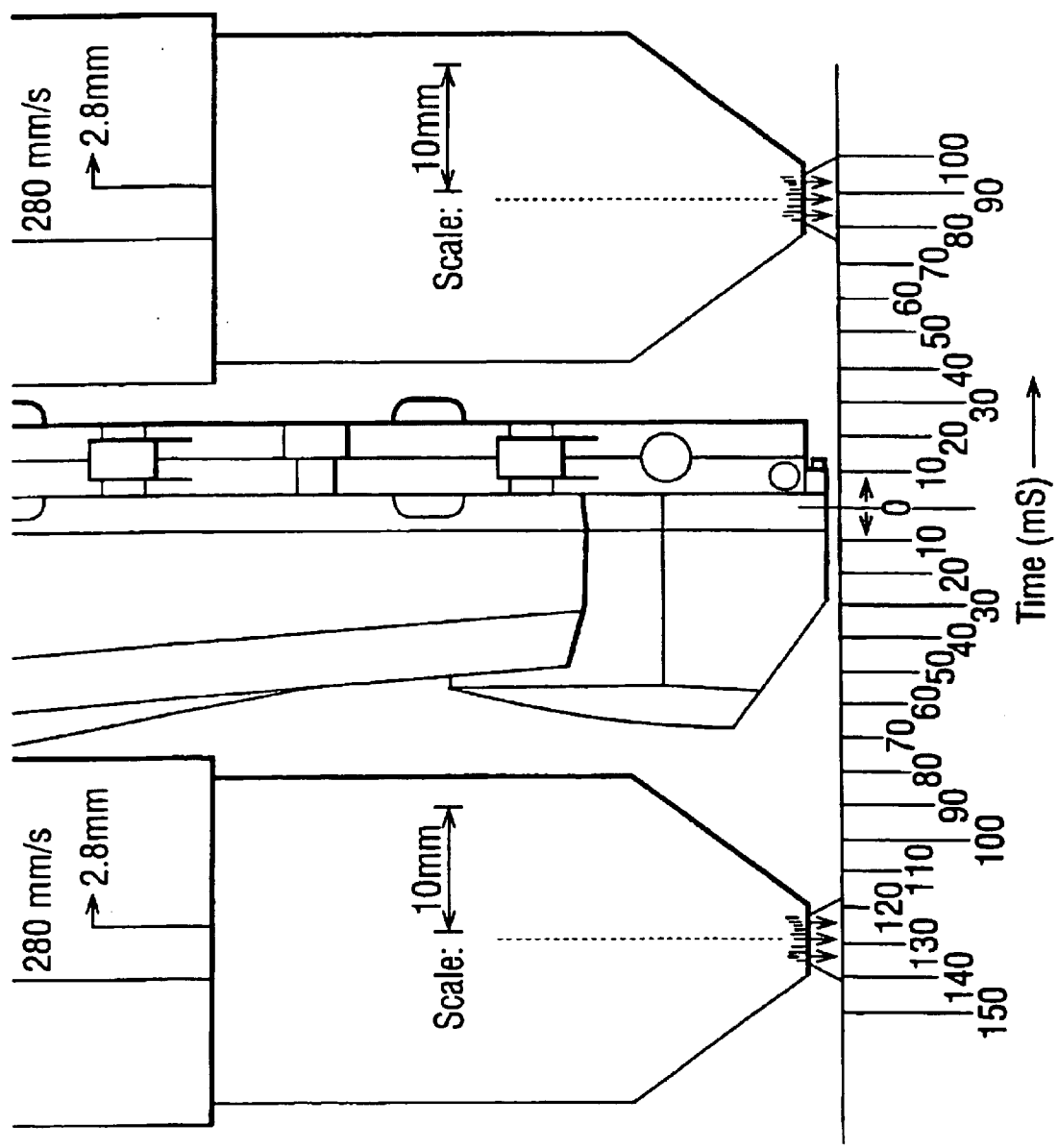
Figure 5B:
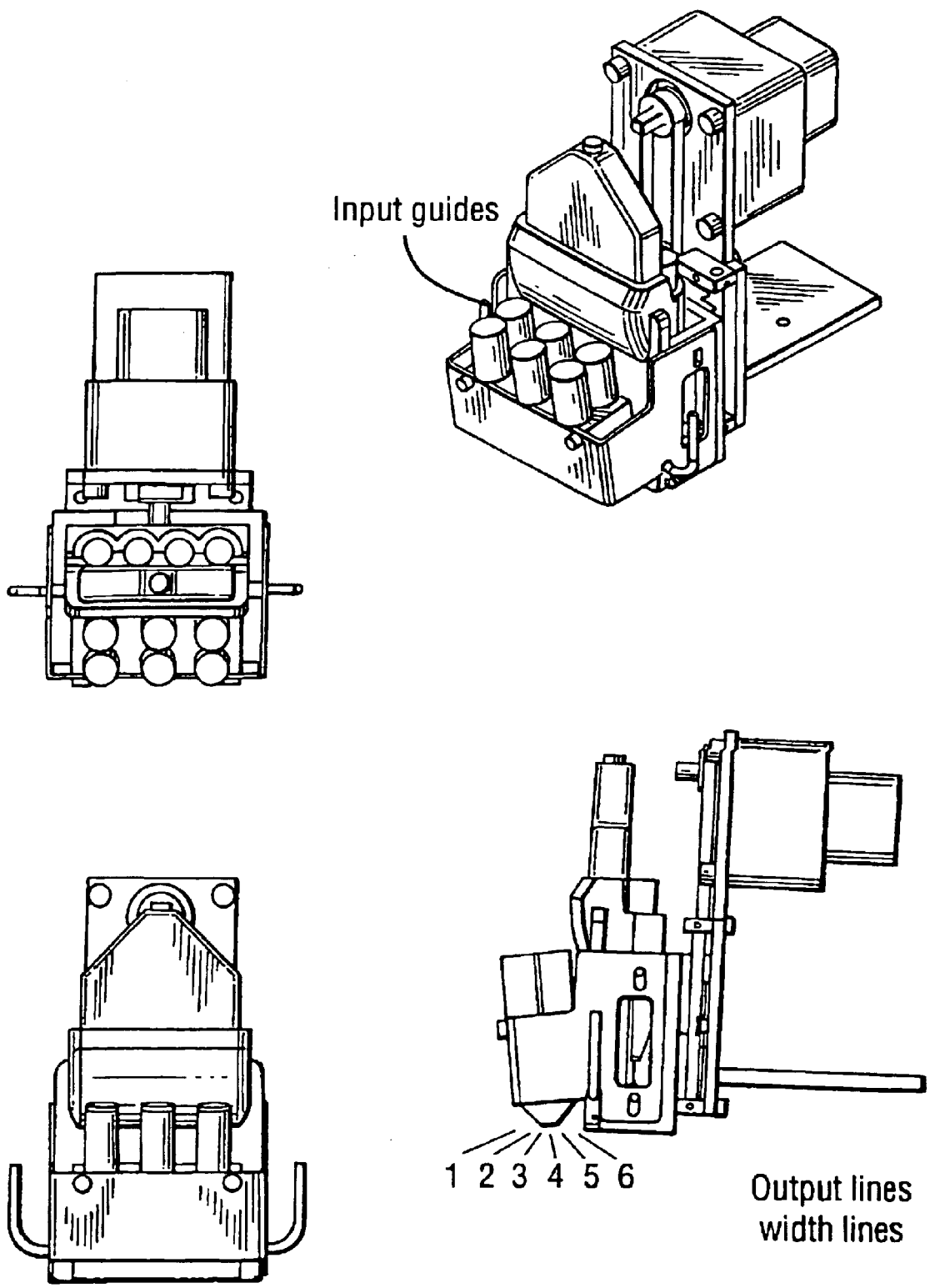

FIG. 5[a–b] are schematic diagrams showing the relationship of the radiation line source to the printhead.

Figure 6:
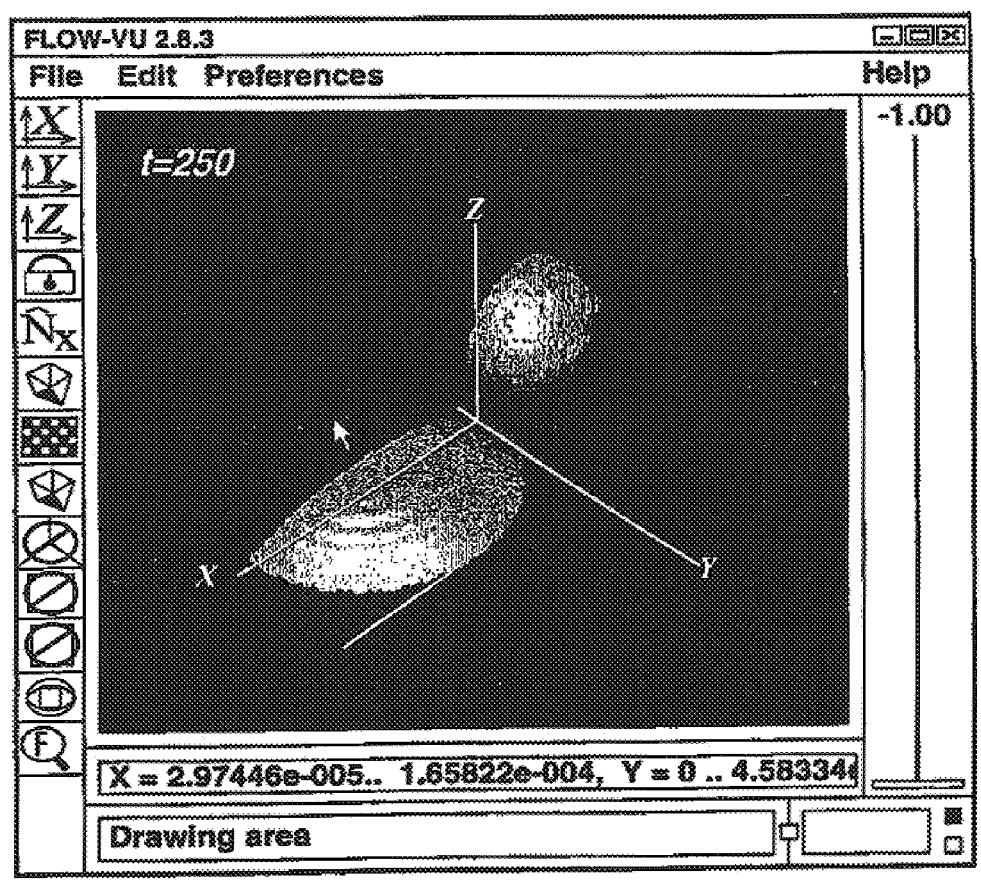

FIG. 6 is a captured image from an animation sequence resulting from a computational fluid dynamic model of the interaction of two ink jet droplets in 3D, covering the time interval from impact out to 250 millisecond.

FIG. 7 is a schematic showing the relationship of the semiconductor laser or light emitting diode (LED) array, addressable radiation source to the printhead.

FIG. 8 is a schematic of a semiconductor laser array integrated on a printhead.

FIG. 9 is a schematic of a high throughput production system based on reel-to-reel flexible substrate transfer.

FIG. 10 is a schematic of a light emitting polymer radiation source depicting ink curing adjacent to the printhead.

FIG. 11 is a schematic of a linear addressable array imaging device (organic photoconductor array, etc.) integrated directly on to the printhead.

Figure 12:
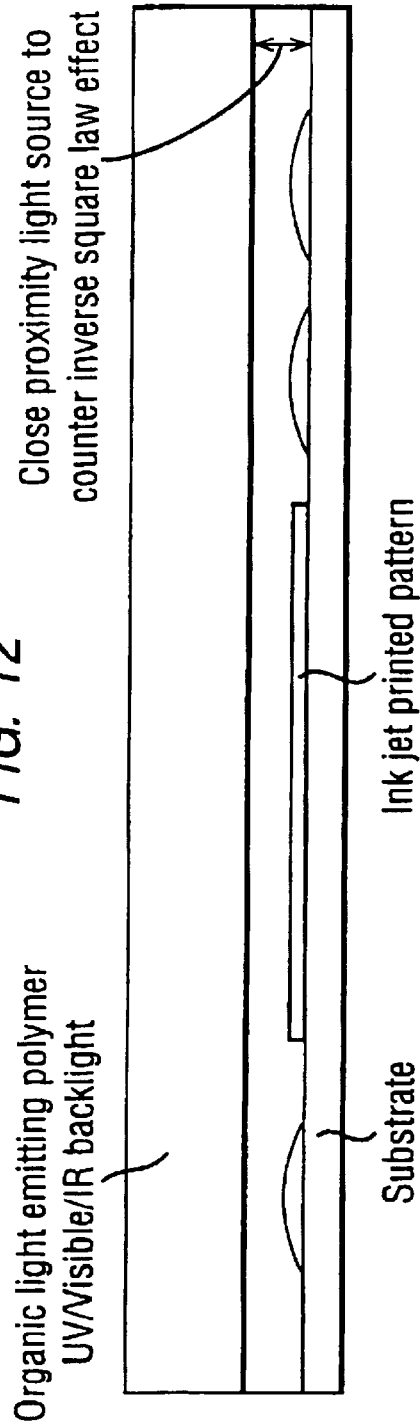

FIG. 12 is a schematic of a whole area imaging system based on organic photoconductive array.

Figure 13:
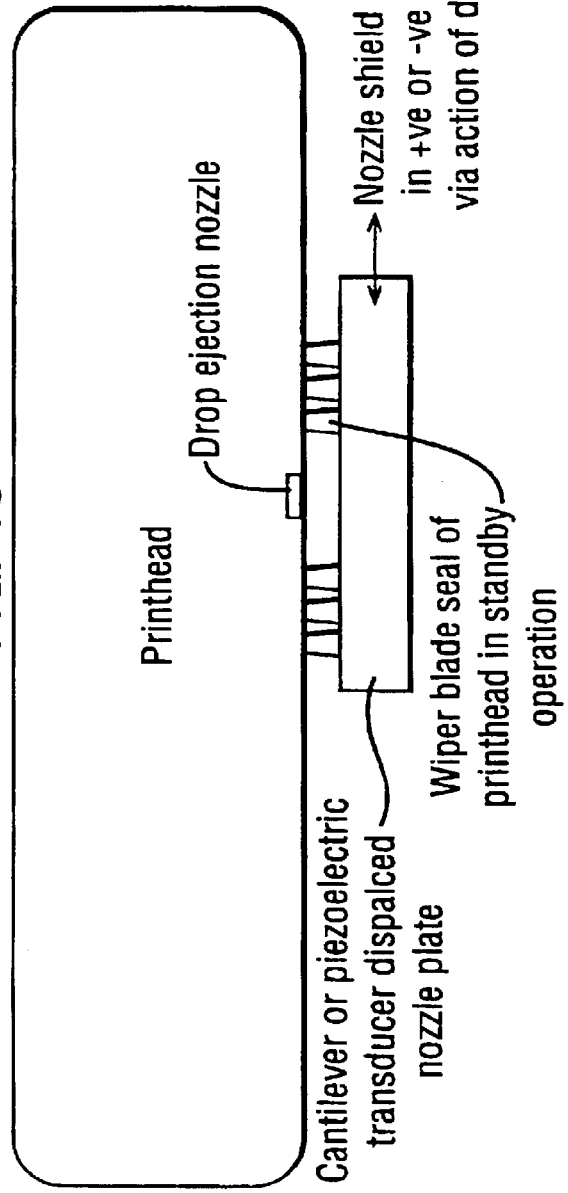

FIG. 13 is a schematic of a radiation shutter and nozzle plate cleaning device integrated directly on to the printhead. Shows the triple acting wiper-blade scheme for real-time cleaning of the nozzle plate.

Figure 14:
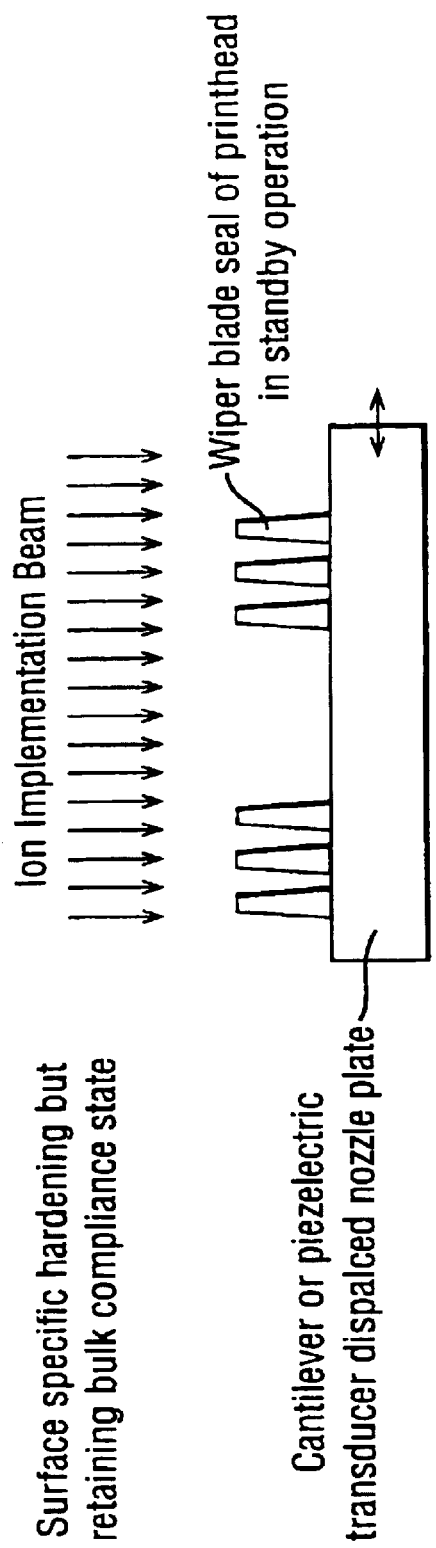

FIG. 14 is a schematic of an ion implanted surface of the triple acting wiper-blade for improved tip stiffness and wear lifetime.

Figure 15:
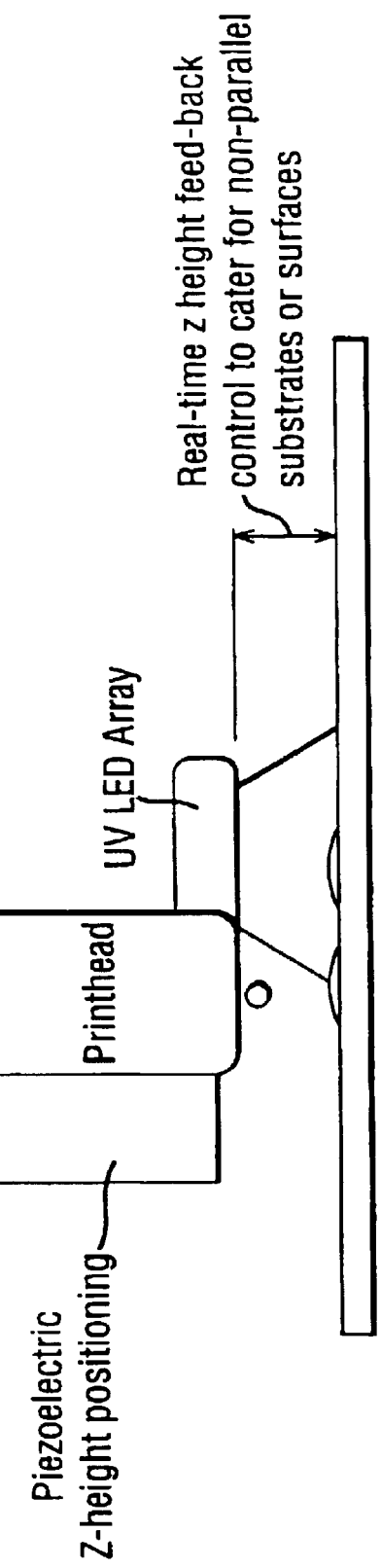

FIG. 15 is a schematic of a bimorph transducer designed to provide real-time printhead height adjustment.

Figure 16:
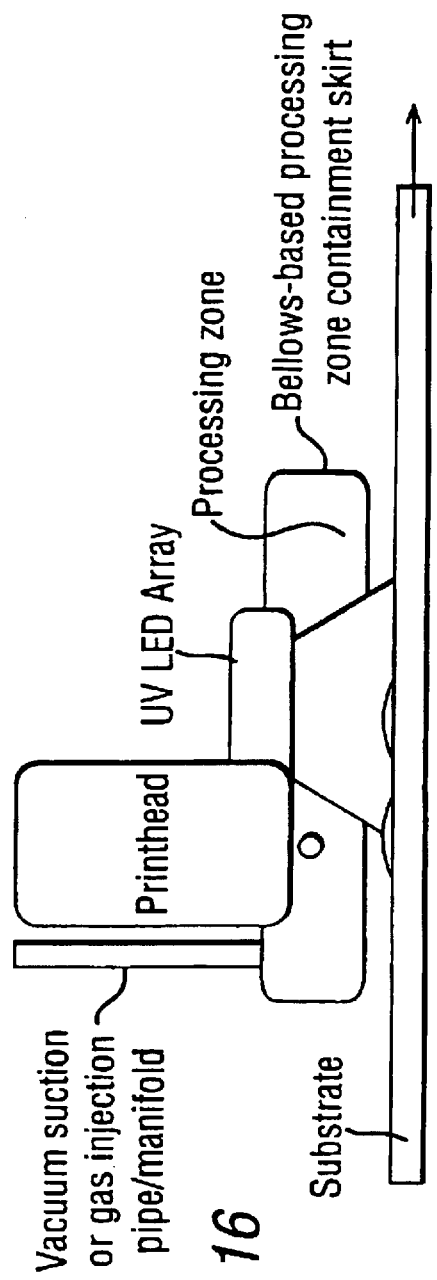

FIG. 16 is a schematic of a localised environment control bellows structure associated with the region local to the printhead only.

Figure 17:
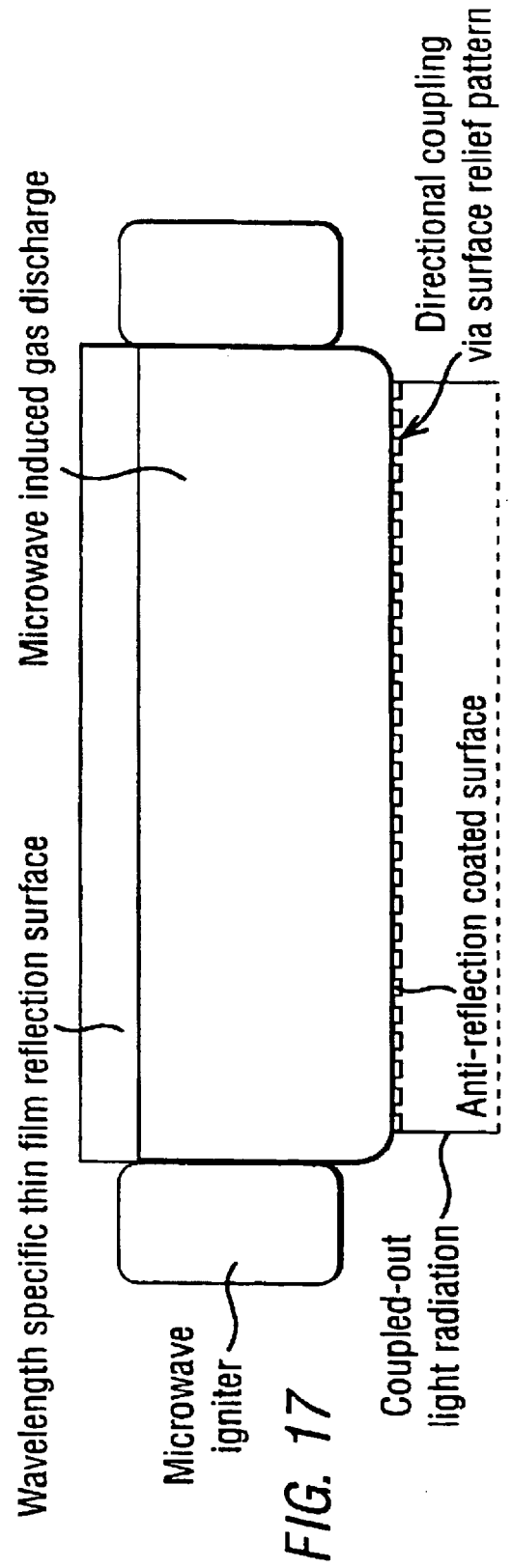

FIG. 17 is a schematic of a whole area microwave induced gaseous discharge that emits radiation from a single plane at a wavelength specific to the photoinitiator employed in the ink being printed.

Figure 18:
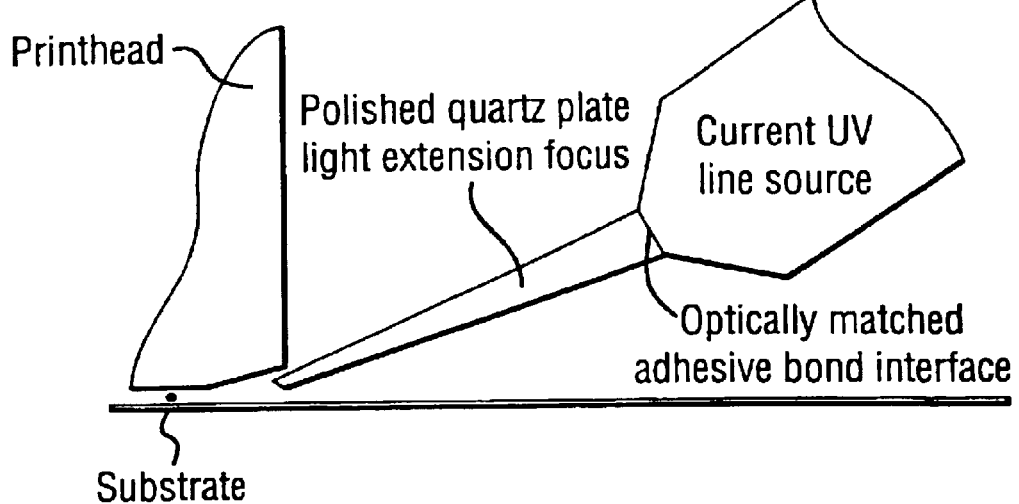
Figure 19:
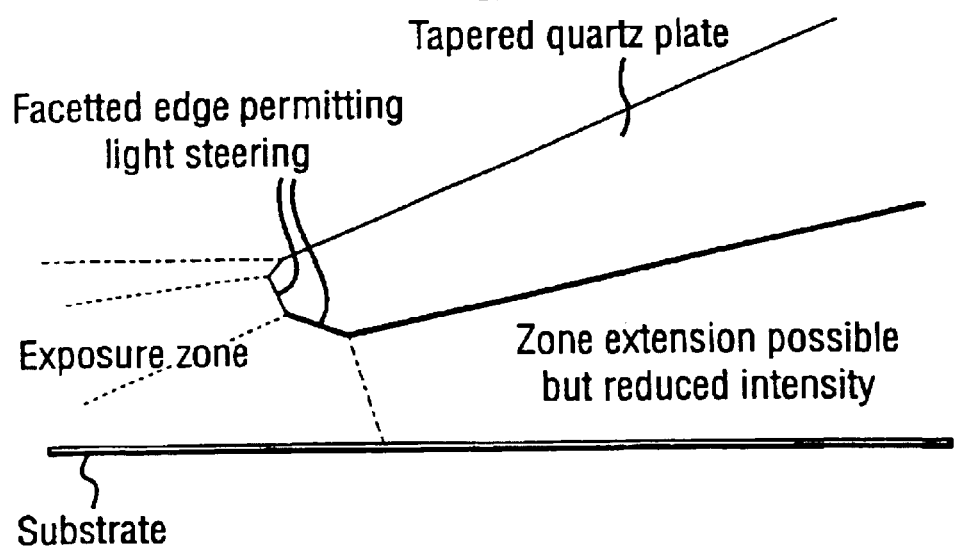
Figure 20:
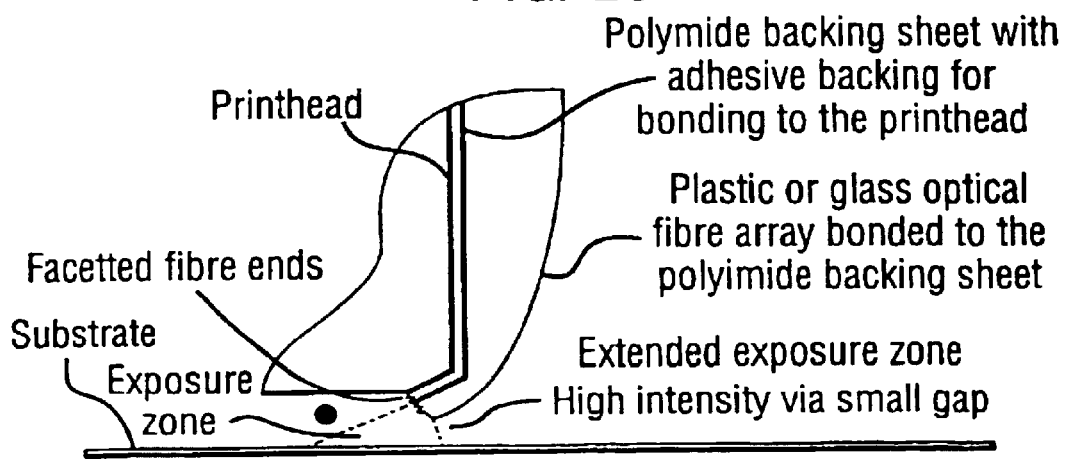

FIGS. 18 to 20 are schematic diagrams relating to the manufacture of a radiation line source that is integrated on to the printhead and provides the transfer of radiation to the site of droplet impact and the region relating to a distance equivalent to a time after impact of 100 milliseconds.

Figure 21:
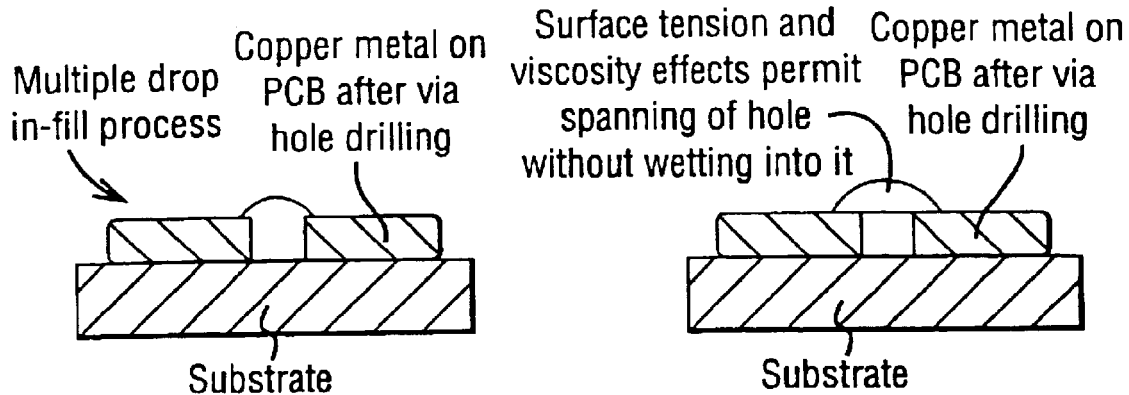

FIG. 21 is a schematic of printed wiring board via hole tenting method.

Figure 22:
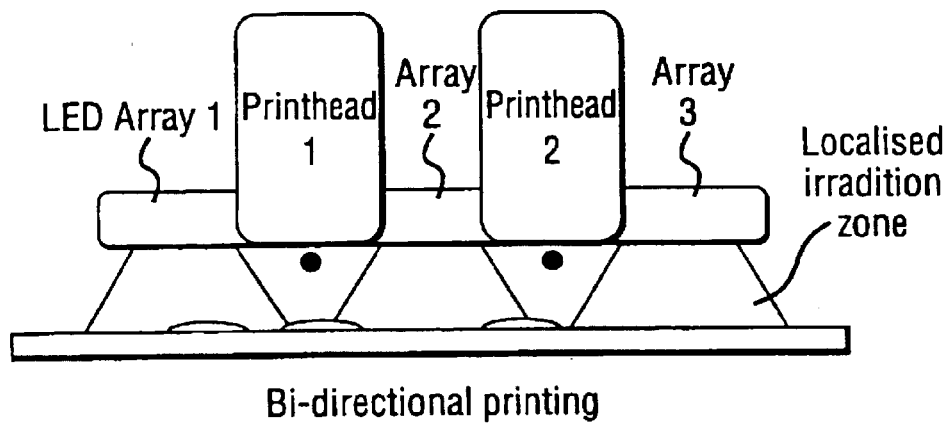

FIG. 22 is a schematic of a common radiation curing system integrated on to a dual printhead arrangement.

Figure 23:
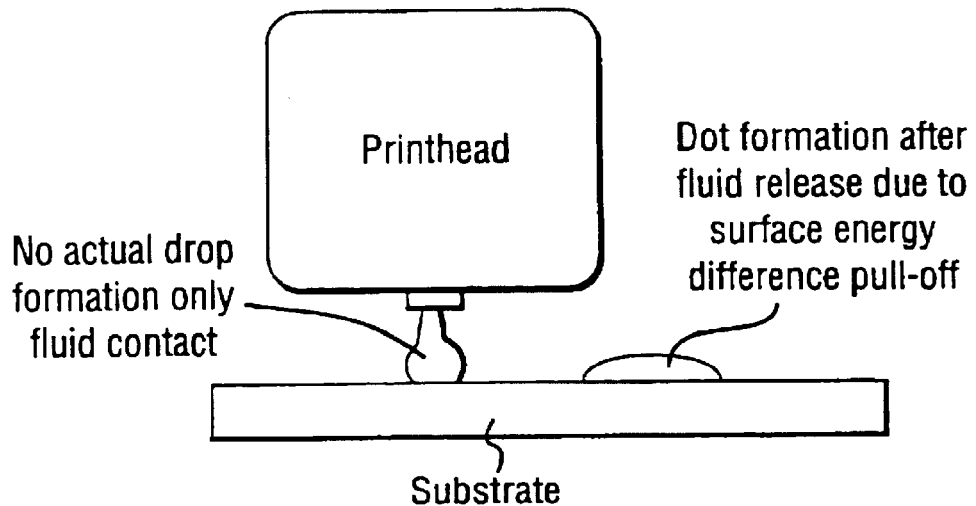

FIG. 23 is a schematic of chemical attachment printing using an ink jet printhead.

Figure 24:
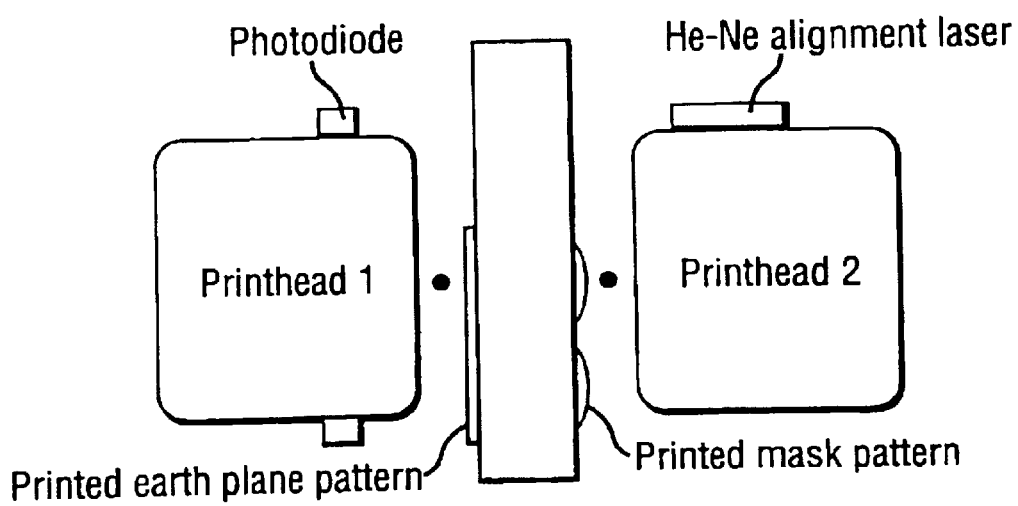

FIG. 24 is a schematic of a dual printhead arrangement that permits back-to-front printing in parallel with a high pattern-to-pattern alignment.

Figure 25:
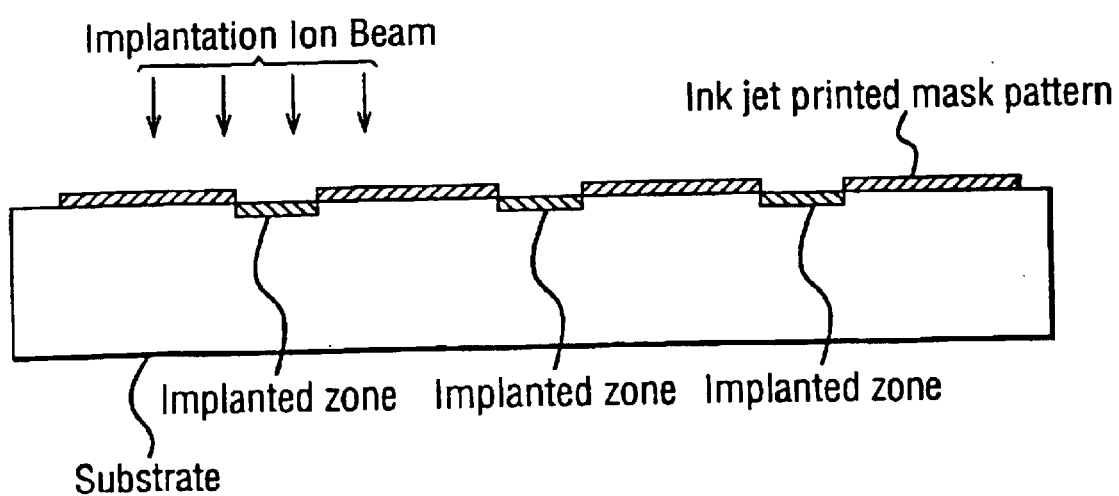

FIG. 25 is a schematic of an drop-on-demand printed ion implantation patterning mask.

FIG. 26 is a schematic of a microvia-hole and containment well pattern mask.

FIG. 27 is a schematic of an drop-on-demand printed stand-off spacer.

A preferred embodiment of the present invention employs, but is not limited to, the use of a XaarJet™ XJ500 printhead. This printhead has a print resolution of 180 dpi and a firing frequency of 4 kHz. Each nozzle has a diameter of 50 $\mu$m that ejects a drop of diameter approximately 51 $\mu$m and volume 70 pL with a firing cycle delay of 83 $\mu$s. The nozzle geometry associated with the 500 nozzle nozzle-plate has a row stagger of 23.5 $\mu$m (customised nozzle plate unit).

This printhead is mounted in the printing system in such a manner as to permit y-axis movement (software-driven motor control) in order to print swathes of text/image data. The printhead can also be moved in the z-axis (software-driven motor control) in order to permit height adjustment in the range 0.1 to 10 mm. The substrate to be printed on moves in the +ve or −ve x-axis at a speed in the range 70 to 504 mm s$^{-1}$, preferably at 280 mm s$^{-1}$. The drive shaft encoder associated with the substrate movement has a resolution of 5 $\mu$m, with an associated print engine encoder divide factor of 14. Alternatively, a linear encoder with a resolution of 1 micron or below may be used for improved addressability. The resulting drop spacing in the axes perpendicular to the printhead is in the range 40 to 90 $\mu$m to match the image resolution, preferably 70 $\mu$m.

The current process employs 2 passes per swathe, including a 70 $\mu$m step (or due to the use of 2 printheads or employing the Xaar XJ1000 printhead, or similar unit), to double the nozzle resolution.

As the image resolution may be imperial (dpi) then suitable addressability on the substrate will also be imperial, and the use of an equivalent encoder signal is required.

Ink used with the Xaar printhead is UV curing, cyan in colour (although any colour or clear ink can be specified), has a density close to 1, a viscosity in the range 9 to 30 mPa.s, and a surface tension in the range 22 to 32 mN m$^{-1}$. This ink requires an irradiation energy density of 1 to 2 J cm$^{-2}$ in order to achieve a full cure state. The drop is ejected from a nozzle using a pressure pulse as a result of the electric field initiated shear in the piezoelectric ceramic. The drop has a impact velocity of approximately 6 m s$^{-1}$.

A drop of UV curing ink impacts the surface and undergoes inertial damping and surface spreading before being solidified by the action of UV wavelength light being exposed to the ink causing chemical cross-linking. The UV curing is in two parts, the first being local to the printhead, and the second being a whole area hard cure process. The local cure (see FIG. 1) is employed to achieve a controlled degree of chemical cross-linking or curing sufficient to control the spreading distance in order to limit the size of the feature being printed. The degree of UV exposure and the time and duration when such exposure occurs is controlled in order to permit the required drop coalescence needed to produce a continuous line of any geometry. In one embodiment a UVP spotcure source (SCL1-6) is employed which uses a 400 W Hg lamp (UV band A). The UV source has 6 outputs that are optically imaged onto the ends of 6 liquid filled fibre optics. Each fibre optic lightguide is butted into an F.S.I. spot-to-line converter. The converter is based on a randomised fibre-optic bundle that is stretched to a specific geometry and end polished. The randomisation permits a greater overall homogeneity of light output (uniform irradiance) because the fibre local is a direct conformal mapping. The line converter has an irradiance output area of 75 mm×4.6 mm, which allows a consistent cure across the full printhead width.

The time delay between the drop impact and first exposure to the localised UV irradiation is up to 1000 ms. The line converter fibre-optic system can be varied in height (z-axis, relative to the substrate surface) in order to reduce the on-set of UV irradiation to a delay time of order 15 to 20 ms (see FIG. 2). These factors are adjusted in order to allow optimum coalescence of the individual drops in all directions (perpendicular axes, curves, 45° bends, etc.) to obtain the best overall line edge straightness, cross-sectional profile, and solid quality.

The final whole area cure is achieved using a Fusion UV F300S curing system. This system uses 300 W per linear inch (1800 W total output) D-Bulb spectral emission (see FIG. 3) to provide full curing of the ink at the optimum printspeed.

Copper clad printed wiring boards employed in a preferred embodiment are pre-treated using a Scotchbrite pad lubricated with IPA, followed by an IPA clean. This pre-treatment facilitates the copper oxide inhibiting, chromate coating removal, as well as, introducing some degree of surface roughening to enhance the adhesion of the ink jet printed, etch mask pattern. Other pre-treatments are also undertaken including an electroless clean (typically, nitric acid chromate removal followed by persulphate microetch) on an anti-tarnish treatment, both of which provide a clean surface on to which an adhesion promoting film or agent can be deposited. Such processes are compatible with a range of standard industry methods. The resulting ink jet printed etch mask pattern has been shown to be adherent to a wide range of copper finishes and other surfaces, including stainless steel, aluminium, plastic, nickel electrode on a ceramic, ceramic, tetrahedrally coordinated carbon, diamond-like carbon, and glass. The solidified ink has been shown to be chemically resistant to, and physically adherent to the substrate in the presence of, a wide range of copper etchants, including those based on cupric chloride, ammoniacal, and alkali recipes.

After etching the mask pattern needs to be removed. This can be achieved in a number of ways, including wet (caustic solution, solvents [including dichloromethane, NMP, etc.]) and dry (reactive ion and inert plasmas) processes.

Next generation mask printing has already identified that the droplet size will become smaller, as per XaarJet™ XJ100 (360 dpi) or greyscale, where a drop size of 21 pL of diameter 36.2 $\mu$m will be available. The associated drop spacing will be in the range 25 to 40 $\mu$m, and the nozzle row stagger and printhead firing cycle delay will be optimised to suit the printhead firing frequency. The resulting etch mask pattern will appear smooth as a result of edge (curve steps, etc.) in-fill with the smaller droplets associated with greyscale operation. Using this set-up the target line width is 50 to 100 $\mu$m. Further system upgrades will cater for higher resolution printing, requiring more precise dot placement (i.e., linear encoded x-y movement to $\leq$1 $\mu$m accuracy and repeatability).

Figure 1:
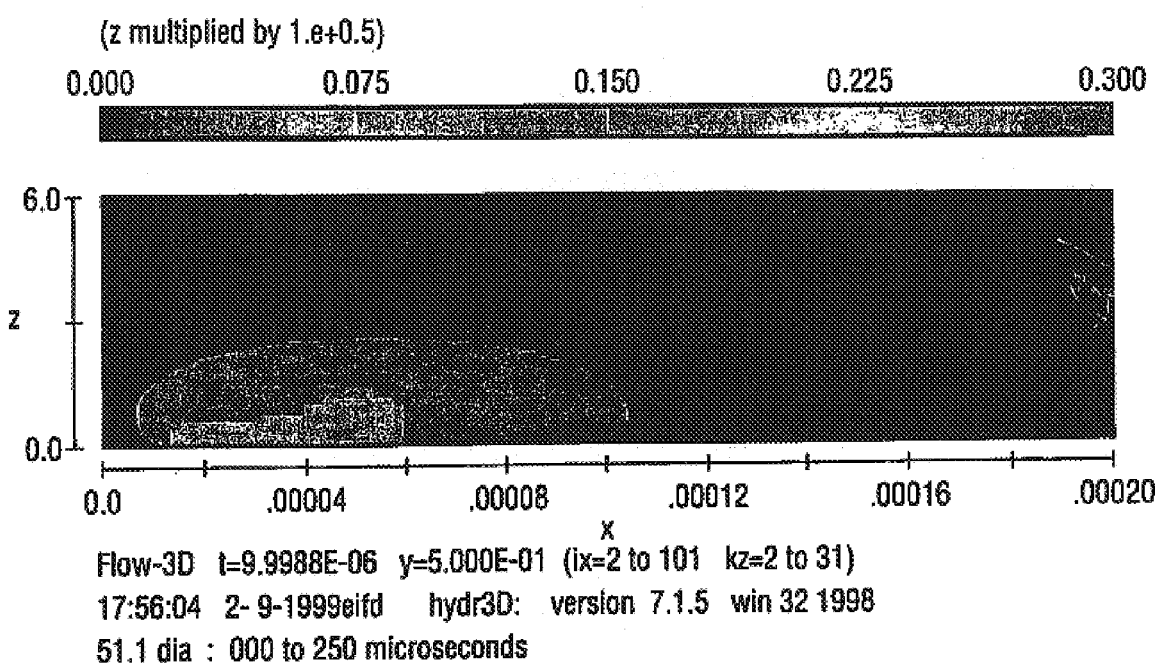

Referring to FIG. 1 the image shows, in plan view, the spreading behaviour of a single drop of ink. The key features are the symmetry of the spreading on a surface that is everywhere isotropic (set as a factor of the model) and the rate of spreading (at room temperature).

The ink employed in this stimulation was a 100% solid polymer that had a viscosity of 10 to 30 mPa.s and a surface tension of 24 to 30 mPa m$^{-1}$. The substrate surface was defined as having a wetting contact angle to the ink of 22°.

It should be clear from such an image that the placement position of subsequent drops with respect to the rate of spreading will affect the drop coalescence necessary to achieve a continuous patterning feature. Moreover, if the ink drops are not controlled with respect to the rate and extent of the surface coverage then a non-parallel edged line will result.

The inventor has realised the importance of the definition of the timeframe over which such control must be exercised and the methods used to achieve it. Computational fluid dynamic (CFD) modelling has been undertaken to study the fluid behaviour, which has been supported by high-speed imaging of droplet behaviour. The key processing requirement is to provide drop coalescence and curing in such a manner as to provide a straight-edge, parallel-sided line.

A particular feature of importance is the ability to control the lateral movement of the printhead in order to select a side-by-side droplet placement distance commensurate with the dot resolution required (subject to the size of the liquid droplet ejected and that actually impacting the substrate surface). The details of the feature to be printed dictate the edge definition that can be achieved with a specific printhead with associated drop diameter. The use of microdot grey scale levels, providing that individual drops can be software accessed/controlled, enables finer feature geometry to be achieved. The importance of this feature resides in the behaviour of the electrical circuit being defined by the mask pattern. The connecting conductor elements in a circuit are expected to be parallel, smooth edged, straight or curved features, ideally possessing no edge roughness. Edge roughening can contribute to signal degradation due to unnecessary scattering events. The detailed understanding of drop placement accuracy as a function of printing mode and print speed, liquid droplet impact and interaction with the substrate surface, and manipulation of the masking material drying/curing is of paramount importance.

A particular importance with respect to this invention is the definition of an operating parameter space for the liquid droplet, irrespective of the print engine or printer operational mode employed.

Figure 2B:
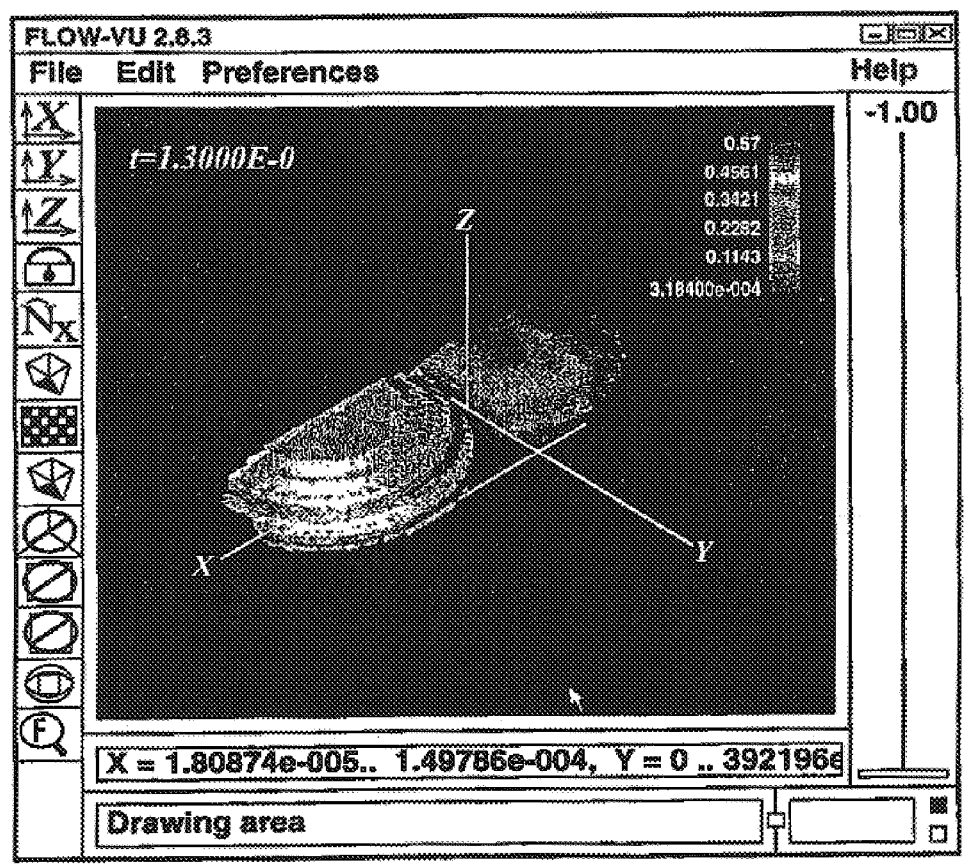

Ink viscosity (5 to 50 mPa.s) for a 100% solid material
Surface tension $\leq$ 40 mN m$^{-1}$
Droplet impact velocity $\leq$ 10 ms$^{-1}$
Droplet diameter $\leq$ 50 $\mu$m FIGS. 2[a–b] and 3 show the inertial dynamics and subsequent spreading behaviour of two droplets that are delayed in their time of impact by 250 microseconds (equivalent to a drop centre-to-centre spacing of 70 $\mu$m). In order to achieve the smallest feature size for a specific ink (viscosity, surface tension, impact velocity, drop volume, etc.) on a given surface (surface roughness, surface energy, chemical stability to ink, etc.) printed in a specified environment (humidity, temperature, particulate density, etc.) it can be seen that the rheology of the ink must be stiffened to the point that movement (surface spreading) is arrested within a timeframe of 970 microseconds. If the spreading is allowed to continue before solidification is induced then the printed line will increase in linewidth until the spreading action is arrested by a balance between the surface capillary force and the ink surface tension.

It should be noted that changes to the ink, printhead, substrate material, printing environment will affect the time period that results in the correct coalescence of the sequence of drops required to print the image of interest. It should also be noted that wet drop coalescing with a solid ink dot (wet on dry non-wetting behaviour to be considered here) will promote a different time period for straight-edged parallel-sided features than that described for the wet drop coalescing with a wet drop outlined above. Changes in such properties do not fall outside of the scope of the invention. In order to achieve such control it is not possible to use a solidification process that is not integrated with the printhead.

The present invention provides the ability to select the time and location relative to the droplet impact zone when the light radiation is allowed to interact with the printed feature liquid ink.

A drop-on-demand ink jet printhead fires a single droplet (or series of droplets) of a specific ink formulation that is solidified at a precise time at the point of, or after, impact with the surface Momentum and surface capillarity induced drop spreading 0 to 15 $\mu$sec—Surface contact with contact angle changing from >130° to <90°.
This is the region that would be used to control the cross-section profile of individual dots.
15 to 250 $\mu$sec—Impact induced inertia completely damped
250 to 1,000 $\mu$sec—Droplet coalescence promotes parallel-sided feature leading to the printing of a straight line.
1,000 $\mu$sec onwards—Ink rheology coupled with the difference in the surface energy and ink surface tension provides energy to promote continual spreading until ink irradiated to cross-link the UV curing polymer.

In a preferred embodiment of the invention, the ink formulation undergoes high speed curing when exposed to electromagnetic radiation. Preferably the electromagnetic radiation includes the wavelength bands assigned to Ultra Violet (including deep UV and UVA, UVB, UVC), Visible, and Infrared radiation (including far infrared), Microwaves, and $\alpha$-particles (alphas).

Figure 4:
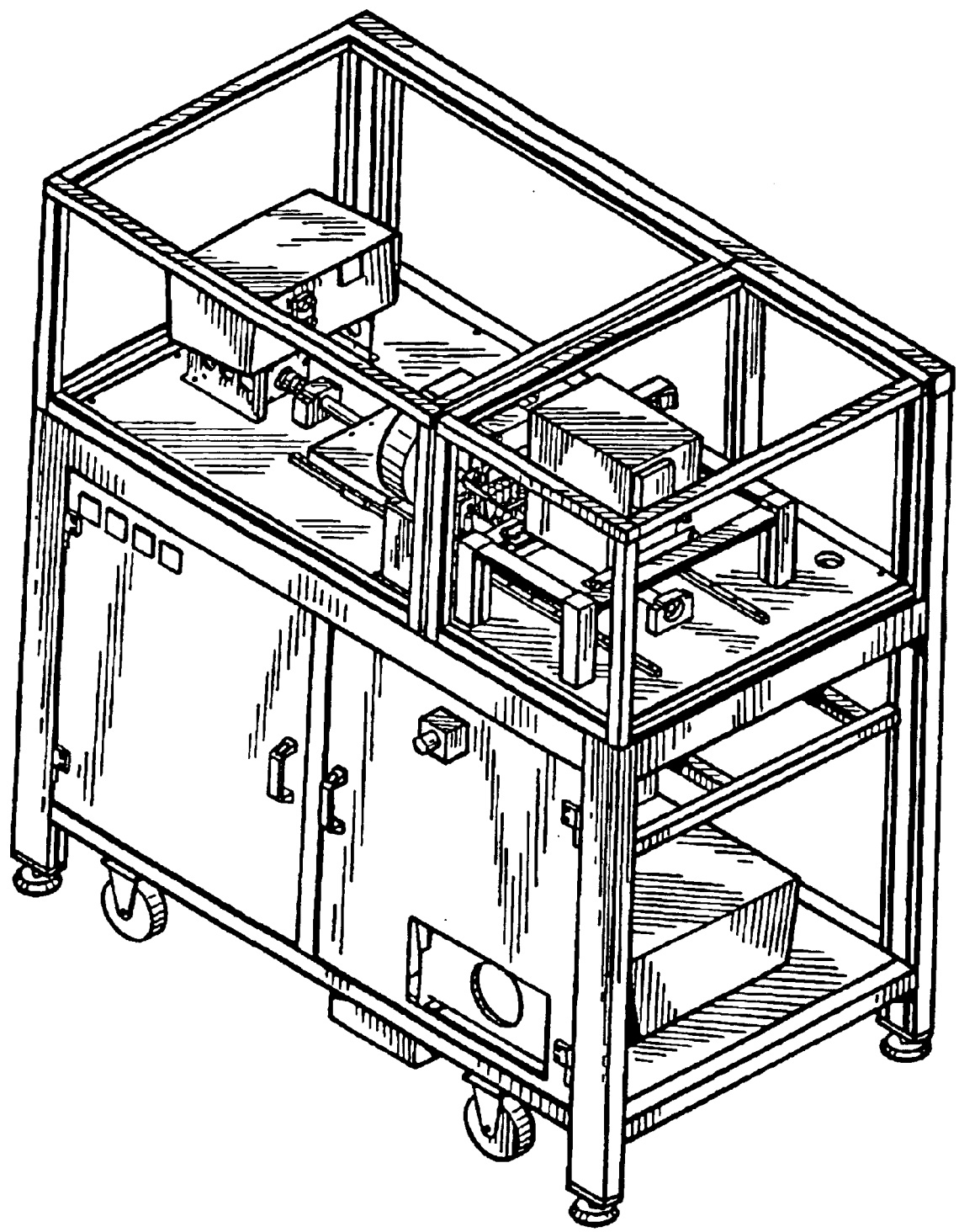
FIG. 4 is a schematic of a preferred printing system layout showing the substrate transport relative to the printhead.

FIG. 4 shows a schematic of the geometrical set-up of one embodiment of an ink jet printing masking system. In particular the schematic shows the substrate travel in the x-axis (direction of print—either positive or negative i.e., bi-directional printing with integrated light source on either side of printhead) at a rate dependent upon the ejection frequency and droplet size of the printhead employed. Printing in the y-axis can be by step-and-repeat swathes or by linear butting of multiple printheads to provide complete coverage with nozzles over the y-axis dimension (board length, etc.) of interest.

FIG. 5 shows a schematic of the geometrical relationship between the printhead and the integrated light source, showing particular emphasis on the location and width of the irradiated area. Also shown is the z-axis height adjustment that affords control over the irradiation intensity. By way of example it is possible to consider a typical printing exercise based on the use of Xaar XJ500™ printhead firing a UV curing polymeric ink. A typical process (see above background information) employs a substrate x-axis transport rate of 280 mm s$^{-1}$ and a drop of volume 70 pL (70×10$^{-12}$ Liters) and 51 $\mu$m diameter ejected at a rate of 4 KHz and a localised ink dot stitching irradiation energy in the range 1 to 200 mJ cm$^{-2}$ (2 to 20 mJ cm$^{-2}$ most preferred) This provides a drop impact centre-to-centre spacing of 70 $\mu$m (see FIG. 6) for a printhead height above the substrate of 0.1 to 2 mm (0.5 mm most preferred). The resulting dot pattern is permitted to spread on the surface for a period of between 80 to 100 milliseconds before being exposed to the integrated UV line source (area 70 mm in y-axis by 4.5 mm in x-axis). The resulting masking material line has a width of 140 $\mu$m. Compensation due to errors relating to drop ejection jet angle, drop velocity, substrate speed, ejection timing have been ignored in the above example.

The method of irradiating the drop-on-demand impacting droplets does not have to be solely due to lamps or fibre-optic light-pipe-based systems. FIGS. 7 and 8 show schematics of preferred embodiments, the electromagnetic radiation means is an independently addressable array of semiconductor solid-state lasers or light emitting diodes (LED's—organic or inorganic). In such embodiments a solid-state semiconductor laser is used to irradiate a drop of fluid in-flight and as it impacts and resides/spreads on a substrate surface, thereby influencing the fluid properties both in-flight and on the surface to limit surface wetting (and hence solid dot/line cross-section, especially for 100% solid polymers) and interfacial impact effects. In order to test if this concept is technically viable then one needs to consider a few basic features. The expected drop velocity will be in the range 1 to 3 m s$^{-1}$. For the purpose of example the figure of 3 m s$^{-1}$ will be used. Let us assume that the printhead-to-substrate distance is 2 mm. Also that the drop diameter is 50 $\mu$m [microns] and the print speed (substrate movement relative to the printhead) is 0.5 m s$^{-1}$ with a drop eject rate of 1 kHz. Calculated transit time, allowing for the angular deviation of the drop flight path, is 1.37 milliseconds.

There will be a mechanical blind spot just in front of the nozzle-shutter assembly where the laser light beam cannot access the ejected drop. Due to a blind spot depth of 0.6 mm the available irradiation time, resulting from the remainder of the drop flight, will be 1.16 milliseconds. Assuming a 100 mW cm$^{-2}$ laser beam intensity and a simple linear absorption then the level of exposure would be 116 $\mu$J cm$^{-2}$.

The irradiation of the drop will not be uniform throughout the flight time. This is partly due to the absorption performance (light exposure photoinitiator loss profile) of the fluid drop and partly due to the homogeneity (concentration and distribution of photoinitiator) of the cross-linking that takes place at the surface and in the bulk of the fluid drop. In this respect one needs to understand the irradiation intensity (mW cm$^{-2}$) and the exposure dose (mJ cm$^{-2}$).

The rate of photochemical reaction depends firstly on the probability of an incident photon being absorbed by the selected photoinitiator molecule, and secondly on the concentration of photoinitiator employed. The object of the initial in-flight and surface exposure is to promote sufficient cross-linking so as to limit or arrest the spreading action of the drop on impact. This necessitates absorbing the drop kinetic energy whilst still effecting an adequate adhesion of the cured drop on the substrate surface. If the laser beam profile is constructed to be a "top-hat" design and that the light intensity is above the required critical threshold, then it might be possible to consider a static irradiation process that covers the total accessible flight path of the drop. A second laser source, exhibiting a "top-hat" beam profile, continuously irradiates the substrate surface just in front of where the drop lands. The laser sources providing a parallel beam irradiation with constructive interference occurring at the point of drop impact. The actual interference area being an ellipse of minimum axis (65 $\mu$m [microns]) 25% greater than the drop diameter. The exposure time for the second laser is dictated by the substrate transfer speed and the "top-hat" geometry employed (for a 1 mm beam line width). The total exposure time is 2 milliseconds. If the "top-hat" beam had an intensity of 100 mW cm$^{-2}$, then the level of exposure will only be 200 mJ cm$^{-2}$ [microjoules]. The clear issue is what intensity and level of exposure is required to photocure a 50 $\mu$m [micron] diameter drop to a level sufficient to inhibit surface spreading (assume 20% cross-linking in the absence of more accurate data). Also need to determine the change in velocity with exposure level and the ensuing influence on the impact properties of a viscous drop on a solid surface. UV cured polymeric ink systems are currently employed in desk-top publishing and wide format printing of colour text and graphics. The standard process is to print the polymer onto a porous paper or treated paper or conventional/treated flexible plastic and allow the ink droplet to reach spreading equilibrium before irradiating with a suitable wavelength of light. This application discloses processing and system details applicable to the radiation processing of ink jet printable inks or fluids, especially UV curing inks with a view to enhancing print resolution.

The inventor has defined a design for a high throughput etch mask printing system based on both reel-to-reel and robotic substrate transfer methods. This is achieved by making use of multiple sets of printheads so arranged as to permit a multiplicity of work stations (see FIG. 9) to be operational along the open length of the plastic sheeting retained between the two tensioned "feed" and "accept" drums.

A radiation curing source based on light emitting polymers (LEP's) that are employed in a strip light or whole area illumination device may also be utilised (see FIG. 10). The radiation curing is achieved as a large area process by making use of thin film inorganic or organic light emitting materials. The thin film device design defines the wavelength band that will be emitted by the device. The emission can be tuned to suit a specific wavelength or wavelengths. Discrete stripes or bands of wavelength can be achieved in the device manufacture. Stripe or band focusing or defocusing can be achieved with a lenticular lens arrangement. The lenticular lens would also be deposited using drop-on-demand techniques.

FIG. 11 shows a schematic outlining a means of dynamic print imaging using a linear imaging device integrated directly on to the ink jet printhead. Future systems will employ in-situ droplet impact imaging employing a fixed width charge-coupled device (CCD) [or x-y addressable] imaging array using co-incident nozzle-to-pixel geometry for real-time monitoring of printhead behaviour in relation to placement accuracy and processing yield (substrate rework). Identification of faulty nozzles (dot/no dot identification) would permit a redefinition of the printing image in order to compensate for the observed faulty nozzles (Artificial Intelligence system operation). The imaging array being placed adjacent to the printhead nozzles in order to obtain localised individual nozzle-drop-dot behaviour. Another preferred embodiment of this invention makes use of a simple organic photoconductive pixel array with integrated organic lenslet array in place of the CCD or x-y addressable Metal-Oxide-Semiconductor silicon photodiode imaging array's.

FIG. 12 shows a schematic of a means of enhancing processing yield by incorporating etch mask pattern recognition and software-based printed pattern overlay comparison using a large area organic photoconductive (photodiode) array. Large area being compatible with a direct 1:1 image mapping so that a complete printed circuit board could be imaged without the need to scan a camera over the board surface. Software then compares the mask pattern CAD image with the image captured from the large area organic photoconductor array. Defects observed would be identified by vector coordinates and if the defect is a missing section of mask then the ink jet printhead can be transferred to the correct location to repair the track.

FIG. 13 is a schematic depicting a bimorph driven electromagnetic radiation shutter. The shutter assembly makes use of a silicon micromachined structure (MMS) that provides the necessary nozzle apertures, which are oversized compared to the actual drop diameter. The internal surface of the shutter assembly (silicon MMS) has fabricated on it a set of nozzle plate cleaning wiper blade-type structures, that are non-wetting to the ink and include easy-flow fluid ducting to permit the excess ink removed from the nozzle plate to be transferred to a catch reservoir at the edge of the printhead, which is periodically emptied using a simple vacuum suction nozzle. In operation the shutter assembly would normal act to cap the nozzle array, making use of the triple blade sealing on either side of the nozzle. The wiper blade type sealing stripes are sealed at both ends to form an enclosed capping arrangement. The firing sequence would be:

1. Standby mode the shutter assembly is positioned so as to cover the nozzle array.
2. Clean nozzle plate by oscillating the bimorph shutter backwards and forwards.
3. Test fire the printhead with a 50 pulse (50 drops) bust for all nozzles in the array. Excess fluid is drained towards the catch reservoir for subsequent vacuum suction removal.
4. Remove excess fluid from catch reservoir.
5. Download CAD image to be printed.
6. Use the leading edge of the drive waveform to trigger the bimorph shutter waveform in order to move the shutter into the firing position.
7. As the shutter reaches the firing position so the droplet begins to be formed at the nozzle exit.
8. Once the droplet is released and is clear of shutter assembly the shutter is momentarily closed, thereby cleaning the nozzle between each jetted drop.

Future printheads will employ drive waveforms that accurately control the timing sequence of order for drop eject, bimorph nozzle shutter micropositioning, and solid state semiconductor laser pulse activation for a "smart" fluid jetting module operation. The nozzle drive pulse can also be monitored, on suitably manufactured printheads, lead to:

modification of firing delay to impact placement accuracy.
gradual change in firing parameter(s) to maintain a given droplet set of properties.
generation of printing test pattern and image grabbing and interpretation leading to software manipulation of placement accuracy versus specific nozzle drive properties.

The in-situ environmental and radiation shutter assembly also acts as a:

real-time pulsed plasma electrode that provides surface pre-treatment adjacent to droplet landing zone.
printhead vacuum priming unit.

The wiper blade nozzle plate cleaning material wants to be compliant, tough, adherent to the substrate, and chemically stable in contact with the fluid/ink system being jetted. Typical materials include, silicone, polyimide, PTFE, rubber, neoprene, polyvinyl, and viton. The surface of the wiper blade feature can be locally hardened (see FIG. 14) to provide a better cleaning action and wear resistance by exposing the surface to a beam of high energy ions (ion implantation or plasma immersion implantation). A typical process would be to use $10^{15}$ ions $cm^{-2}$ of nitrogen implanted into say Teflon coating at an energy of 70 keV, to produce a total range of ion uptake of 231 nm.

A number of droplet firing waveforms and sequences catering for variable speed radiation curing printing, which includes very high speed, may be required to support the wide variety of applications making use of this technology. Very high speed includes the situation where the piezoelectric or relaxor type ink jet printhead is operated in a resonance mode (up to approximately 1 MHz or so).

Surface pre-treatments in-situ, and prior, to printing an etch mask or surface relief pattern, may be required to ensure adequate adhesion and to limit surface wetting. The means of providing the surface cleaning being based on localised creation of ozone, UV exposure, acidic or alkali jetting from a spray head or an ink jet printhead, or solvent dispensing from a spray head or an ink jet printhead, including a means of drying. A number of manufacturers make printed wiring board substrate material. In most cases the metal is copper and is either vacuum or adhesive laminated on to the substrate of choice (FR4, PTFE, polyimide, etc.). Invariably this means that the surface quality from each is different either in texture on a microscopic scale or in planarity (reinforcing fibres, foil rolling stress lines, etc.) on a macroscopic scale.

Ozone plasma
Specific plasma
Localised UV irradiation

All of the above substrate pre-treatments are to be considered for compatibility with both wet and dry etching methods. This is because the etch mask printing process can be applied to surface other than copper, that are not necessarily compatible with high resolution wet etch processes. It is a preferred embodiment to consider printing a negative image of the image to be achieved with the masking layer. This negative image being a non-wetting coating that affords limited spreading of the masking material. In order for this technique to work it is important that the printing parameters and masking ink are selected so as to inhibit splashing and excessive inertial effects upon drop impact. If this occurs then "over-wash" can occur that if the receding angle is high will result in ink spreading over the negative non-wetting control print.

Preferred embodiments of the present invention can provide real-time height positioning of an ink jet printhead using a bimorph positioning transducer that permits printhead movement in the z-axis (see FIG. 15). Height adjustment is preferably in the range 50 to 200 microns. The tip deflection distance of a bimorph cantilever is proportional to its length, as given by $x(L, V) := 2.3/2 \cdot d_{31} \cdot L^2/t^2 \cdot V$ (t=bimorph thickness; L=bimorph length; $d_{31}$=charge constant [i.e., $-306 \times 10^{-12}$ $CN^{-1}$ for Morgan Matroc PCK5]; V=drive voltage). For a drive voltage of 100 volts and a bimorph length of 15 mm expected tip deflection will be approximately 100 microns at a free resonance frequency of 1,200 Hz. Bimorph height control of printhead using semiconductor laser height range finder with feedback to bimorph. Bimorphs positioned at either end of printhead. Real-time adjustment of height to facilitate very close proximity printing of less than or equal to 250 $\mu$m (microns). Real-time position is a direct result of feedback signal from electro-optical (laser [range finder principle] or LED in conjunction with a phototransistor or photocell pair) or capacitive sensing element. In the limit the height control would lead to direct transfer contact wherein the ink is not fired as a droplet at all but is transferred on to the substrate surface via differential wetting action that forces the pressure induced droplet "Necking" to break. Head height control can also be due to inductive sensor response for metal substrates.

It is anticipated that temperature and atmosphere control of the operating zone adjacent to the printhead will be required. Such localised atmosphere control (see FIG. 16) provides a much cheaper means of controlling the required deposit than that due to atmosphere control associated with the whole area to printed on. The control zone is defined as the area bounded by the printhead nozzle plate in the +ve z-axis and the substrate surface in the −ve z-axis, and the length and width of the nozzle plate including a factor that allows for edge effects. This zone can in one embodiment be achieved by surrounding the printhead and integrated dot imaging and radiation curing source in a bellows-type structure that provides a positive pressure of air or a specified inert or reactive gas injection (gas being heated or cooled). A soft vacuum can also be supported within the bellows, making use of a dry vacuum pumping arrangement. The bellows structure will be made of a soft, flexible, low gas permeability, electrically conductive material that both assists surface cleaning and surface electrical charge dissipation. The etch mask material printing and cure will take place inside this envelope. Close proximity printhead head to substrate spacing requires consideration of:

electrical potential across the printhead-to-substrate gap as contained within the processing bellows.

vacuum suction and air flow induced pressure differential in the processing bellows.

air flow filtering to minimise particulate accumulation in the printhead-to-substrate gap by filtration of the air or gases used in the processing bellows. If vacuum employed then particulate in-take would be minimised by presence of bellows. Consideration to be given to the height between base of bellows and the substrate surface.

For high throughput printing it is preferable to employ a wide format printing capability by fabricating a printhead enclosure that can house a multiple of printheads. This is achieved by butting together a series of printheads with a common nozzle format. This is required to ensure that although the number or nozzles is increased the resultant parallel-sided pattern is not affected. The butting error could compromise such print, hence the need to integrate a common nozzle plate. The close coupled (butted) printheads are aligned in x-y-z axes by utilising piezoelectric positioning of a He—Ne sighting laser assembly that can be removed once the alignment has been completed and the set-up locked in position. Such positional accuracy is essential if the geometrical limitations of the etch mask pattern is to be maintain across the substrate surface to be coated. Another preferred embodiment is to use a multiple printhead alignment using piezoelectric positioners that employ a feedback-loop driven by the in-situ imaging of ejected drops on to a set of test patterns that are imaged and overlaid on to the test pattern to define the nature and degree of feedback control required.

Ink formulation for optimisation of the mask pattern linewidth control have been studied. It has been shown that the glass transition temperature, $T_g$, affects the hardness and temperature stability of the current acrylate ink, without adversely affecting the viscosity and surface tension of the ink. It has been shown experimentally that changes in the bulk-to-surface photoinitiator ratio also affect the rate of curing. Changes to the photoinitiator ratio in the range 1:1 to 4:1 (surface:bulk) have been shown to promote faster curing. Too high a surface initiator content promotes in-nozzle blocking before droplets can actually be ejected. A range of fluid properties must be optimised in order to provide a minimum in the droplet surface spreading and hence the linewidth and cross-sectional profile of the mask pattern, irrespective of whether the ink drop is solidified by air drying, or by radiation, curing methods. Such properties include:

| | | |
|---|---|---|
| Droplet velocity | = | 0.1 to 10 [ms$^{-1}$] |
| Dynamic viscosity | = | 1 to 100 [mPa · s] |
| Heat of vapourisation | = | Low [J mol$^{-1}$] |
| | | (Liquid dependent) |
| Liquid density | = | 0.5 to 1.8 [kg m$^{-3}$] |
| | | (Liquid dependent) |
| Material solid content | = | 0.0001 to 100 [%] |
| Static contact angle to the substrate | = | 0 to 120 [°] |
| Substrate temperature | = | 230 to 370 [K.] |
| Surface tension | = | 35 to 76 [mN m$^{-1}$] |

The ratio of bulk to surface photoinitiator also has an effect on the rate of solidification. This is also the case for the surface tension and the glass transition temperature, $T_g$, of the polymer used for the mask. In a preferred embodiment the ink formulation is compatible with the operation of an integral fluid nanoscale filter, which is based on Lamb wave fluid transport principles, where the fluid is flowed through a porous silicon etched (chaotic) filter structure. Lamb wave electrode design for fluid transport through filter and for providing controlled fluid feed to the nozzle. Provides for precision metering of fluid and timing of arrival at the nozzle bore.

The present invention can also provide a means for large area polymer cross-linking (for extended time or hard cured etch mask material solidification) by making use of a close proximity (to the printhead assembly [x- and y-axes] and to the substrate surface [z-axis]), low temperature (not requiring any assisted cooling), microwave initiated gaseous discharge radiation source (see FIG. 17). The gas discharge radiation source provides illumination on the substrate surface only because the upper surface of the assembly has had deposited on it a thin film coating that reflects light back into the body of the discharge (light guide), thereby enhancing the coupling-out efficiency, and the lower surface has had fabricated in it a surface relief pattern that permits the discharge induced photo species to couple-out on to the substrate surface and thereby irradiate the mask material. The surface relief required to extract the plasma discharge photons of the desired wavelength (gas specific) can be a dispersion structure such as diffuser, dot matrix, or moth-eyed lens matrix.

A preferred embodiment makes use of lenticular lens type array, where the nearly rectangular cross-sectioned (variable angled wall geometry of angle ≦90°) projection width, height, and wall slope affect the efficiency of coupling for the wavelength of light specified. The light guide and gas discharge (plasma) confinement structure are made of quartz or similar UV transmitting material. The close proximity assembly assists the transfer of photo energy ($\mu$J or mJ cm$^{-2}$) without significant loss due to the path length (inverse square law effect). In a preferred embodiment whole area microwave initiated gas discharge supported UV irradiation will be used for large area panel final cure exposure. The grating structure outlined above is designed to match the wavelength of light, which is dictated by the gas chemistry employed. Such gases include Ar, He, Cl, Xe, $O_2$, $N_2$, etc. and mixtures thereof.

Another preferred embodiment of the grating structure is a set of rectangular features that replicate a "castle turret" type geometry forming peaks and trough. The mark-space ratio and the geometry of the mark rectangle (height and width and wall slope) depend upon the wavelength of light to be coupled out of the window surface.

In a preferred embodiment the reflecting surface (thin film aluminium, gold, etc.) can be included on the outside of the upper (roof) of the enclosure to enhance the efficiency of the output of the exposure unit. This UV curing unit would operate at power levels that would not require noisy and bulky air cooling. Recirculating gas cooling can be introduced if high power applications are required.

A specified nozzle plate geometry may be provided to affect the placement control of the drops ejected from the nozzle array. Not all printheads eject ink drops from adjacent nozzles simultaneously. This is because for piezoelectric-based ink jet printheads the mode of operation can be due to a bending, pushing, or shearing action. If shearing action is employed (i.e., Xaar XJ series printhead) then a nozzle stagger must be defined in the nozzle plate to permit straight text printing. In order to obtain a coalescence of drops, leading to a well defined line, it is necessary to vary the drop spacing by operating the printhead outside of standard parameter range. For the Xaar printhead the firing delay implies a substrate movement that leads to a series of drops being printed on a stagger. In order to achieve a straight line process a number of potential solutions are possible, namely:

1. Reprogram the cycle time delay to another fixed value.
2. Fabricate a nozzle plate with a different nozzle stagger.
3. Change the image processing to increase resolution.
4. Reprogram the chip with a single cycle waveform i.e., all channels fire at the same time and use image processing to cater for the fact that this is not practical (implication on print speed).

A preferred embodiment of the invention provides for a specific set of nozzle plate designs to cater for the ink jet printing of a mask pattern that has a parallel line width in all direction on an x-y plane.

The present invention can be extended to a method of ink jet printing an electrode surface solder mask pattern. In this instance the method used to form the solder mask is similar to that used to form the etch mask defined above, with the difference being that the choice of ink formulation must reflect the higher temperature limits applied to the solder dip coating and thermal wave solder reflow processes. The solder mask is designed to provide a means of limiting the region of a suitably treated surface that can be coated with a solder metal such as In, Sn Pb—Sn alloy, etc. Soluble materials that can be used as the solder mask include silicone, polyimide, PTFE, and epoxy.

The present invention can provide a method of achieving a 3-D etch mask using ink jet printing methods. A number of device fabrication applications require the production of a variable build height or etch depth feature. It is possible to use the ink jet printing process to define such a feature using either multiple drops solidified at a specific site or multiple passes of a pattern where the pattern being printed can be different each time. In either case the mask being generated has a local change in height profile. The mask can either be left as a solid structure forming a 3-D relief structure on a surface or can be used in an etch process whereby the mask material is progressively etched over time by the etchant. The progressive etching promotes a local change in etch depth, particularly for a reactive ion beam or plasma dry etch process. The mask material can be of a single type with the progressive etch rate being constant and the etch depth change being due to the variation in thickness and hence the rate of mask consumption to expose the surface undergoing controlled etching. The mask can also be made up of a number of materials that have different etch rates (etch resistance) to the etchant employed. In this case it is possible to define a completely robust etch mask at a specific location in the mask build, thereby permitting etch control unit x, y, and z (depth) axes.

A UV (or alternate energy/radiation) line source may be used in the manufacture of an etch mask pattern. Such a line source may be required to provide a uniform area of radiation (UV-visible-IR-electron) exposure across the width of the selected printhead and to provide a specified area of exposure and for the exposure to occur at a specific location relative to the drop impact zone. The line source can make use of a fibre-optic bundle that is fanned-out to give a single line of fibres of individual diameter in the range 0.25 to 1 mm (see FIGS. 18–21). The line of fibres are in direct contact and are secured to a polyimide sheet backing material that provides some degree of rigidity and ease of handling. The flexibility of the fibres and the backing sheet permit the fibre bundle to be shaped to the correct position and angle for radiation exposure at, or adjacent to, the drop impact zone. The front surface of the fibre bundle can have bonded onto it a lenticular lenses that provides a high degree of light homogenisation across the whole array of individual fibres. A number of such fibre bundles can be constructed that provide a set of irradiation zones that are deliberately overlapped to form a large area exposure or are left isolated to provide pulsed exposure at, and for, set time intervals as the substrate transverses the irradiation zone.

Alternatively, local curing may be achieved using a xenon lamp with variable duty cycle, operating frequency and spectrum (by using filters and/or doping of lamp gases and/or varying power supply to lamp).

The present invention can be extended to a method of covering (tenting) printed wiring/circuit board plated through-holes using the ink jet printing process (see FIG. 21). Typical plated through-holes range in size from 0.1 to 1 mm in diameter. The testing process can be approached in two ways, namely, plated hole in-fill or surface tension driven coating.

The in-fill process makes use of a multiplicity of droplets that under the action of capillary forces causes the droplets to fill the plated hole. UV curing solidifies the fluid to form a solid plug.

Surface tension driven coating process requires that the drop size be greater than the size of the hole to be covered. Moreover, the surface tension of the fluid needs to be control so as to limit the degree of surface wetting, whereupon the fluid surface tension restoring forces will tend to make the fluid take on a hemispherical geometry that covers the plated hole as desired. The fluid is again solidified by exposure to radiation (UV-visible-IR-electron).

The techniques described above can be extended to a method of removing an ink jet printed UV cured acrylate etch mask. The removal process can be either dry or wet. The dry process makes use of a plasma based on a variety of gas chemistries including argon, oxygen, argon-oxygen mix, $CF_4$-oxygen mix, argon-water vapour, etc. (Inert gas rare-earth series, Reactive gas being hydrogenated, oxygenated, chlorinated, fluorinated, etc.). The inert gas, such as argon, provides an ion that bombards the masking material with a view to disrupting the surface/near-surface regions (termed "Altered Layer"). This disrupted zone permits easy transport of reactive species in to the bulk of the masking material, as well as, providing direct access for such species to the exposed carbon backbone of the acrylate chemistry. The electronegativity of the competing species (i.e., C—C, C—H, C—O, C—F, etc.) coupled with the extraneous energy dissipated by the hot (high energy) ion provides the necessary thermodynamics to permit high rate etching of the acrylate to occur due to place exchange reaction. Etch rates in excess of 1 im [micron] per minute are readily achievable.

The wet process can make use of both aqueous and non-aqueous solvent systems. Aqueous based chemical etchants are primarily caustic-based [typical process being spray injection via roller feed of 5% NaOH in $H_2O$ at 30° C.]. The non-aqueous solvent used to remove the acrylate mask include:

Chloroform (dissolution action)
Dichloromethane (swelling and dissolution action—quick removal)
Tetrachloromethane (dissolution action)
Chlorobenzene (swelling action)
1,1,2-trichloroethane (dissolution action)
N-methyl pyrrolidinone [NMP] (swelling action—slow process)

Similarly, the above techniques can be applied to a method of ink jet printing of dry etch resistant, inorganic etch mask. Although the etch mask process described above makes use of an acrylate (organic) material the ink jet printing method can equally provide etch masks based on inorganic or mixed organic-inorganic fluid systems. In such cases the properties of the fluid and chemically stability with respect to the printhead materials and nozzle non-wetting coating still apply.

The method used to solidify the drops may be dictated by the fluid system employed. An organic-inorganic fluid (ormocer—organically modified ceramic, sol-gel, metallo-organic, etc.) can still employ radiation curing, such as UV. However, dependent upon the application a further level of solidification will be required that makes use of thermal densification. In this case either rapid thermal methods can be applied using close proximity irradiation or sequential transfer to a processing zone. The thermal annealing process is used to densify the mask material and to drive out high etch rate organics. The ensuing material then possess a specified degree of radiation (plasma) hardness that makes it suitable for dry etch masking applications.

The present invention also extends to a method of drop radiation curing making use of a dual printhead arrangement with a common integrated radiation curing source (see FIG. 22). This arrangement has a radiation source located at the outer edges and the centre of the dual back-to-back printhead arrangement. This permits the printhead to print in a bi-directional mode, providing the same degree of radiation exposure irrespective of the forward or reverse direction print.

The above described techniques can be applied to a method of ink jet printing of electroless and electrolytic plating bath resistant, etch mask patterns. The method of printing is the same as for printed wiring board etch mask printing. The difference is in the choice of materials used and the need to construct a mask pattern that is 3-dimensional in nature. The 3-D printing has been described above. The selection of the mask material depends upon the specifics of the electroless and/or electrolytic plating bath solution chemistry. Typical materials include epoxies, polycarbonates, silicone, PTFE, polychlorotrifluoroethylene, polyimide, polyisoprene, and polypropylenepolystyrene, etc.

An additive plating etch mask may also be formed using ink jet printing. This is a specific use of localised height build, as covered under the 3-D printing heading above.

Additionally a high resolution etch mask may be formed using ink jet printing. High resolution has a different meaning dependent upon the application being served. For the purpose of this disclosure high resolution means a feature size of less than 10 im [microns].

An electrically conducting masking layer can also be formed using the above described techniques. Such a masking layer can be left in place after use, as in the seed layer for electroless/electrolytic plating of an electrode pattern. The masking layer can be carbon-based or metal acetate-based (i.e., palladium), in order to effect a specific conductivity and chemical interfacial reaction prior to plating up with the metal of choice.

A decorative surface etch mask may also be formed. The decorative surface may be based on the properties of the ink(s) being used to form the surface relief pattern. By way of example it is possible to use an optical particle-loaded ink that upon solidification reflects light at different wavelengths dependent upon the exposure wavelength and angle. Such a system could be used as a security device due to the unique nature of the particulate distribution in the solid that can be imaged and recorded as a secure signature.

A mask pattern may be formed based on chemical attachment transfer (see FIG. 23). Chemical attachment can be through chirality or via a hydrophilic-type reaction on a catalyzed surface. The attached energy provides a means of transferring a known volume of fluid from a close proximity partially fired droplet, ensuring that the droplet ligament breaks under controlled conditions. Computational fluid dynamic modelling has shown that such fluid transfer (FlowScience) does occur under specified fluid surface tension and substrate surface energy conditions.

A single panel printed wiring board (PWB) back-to-front auto-registered etch mask may be formed (see FIG. 24). The process can make use of two facing printheads or butted linear arrays of printheads, that have been aligned relative to one another using for example a He—Ne laser beam and a silicon diode photodetector. The alignment being effected using piezoelectric bimorph positioning devices (or similar) of the x-y-z axes and the orientational azimuth of the printhead/printhead array. Once alignment has been effected then a panel can be transported in a frame to positioned midway between the printheads (or arrays) and a dual print achieved on both surface that register to a very high degree.

Near vertical-walled mask patterns may be formed. Computational fluid dynamic modelling (based on FlowScience Inc., Flow3D modelling software) of ink jet printhead ejected drop interaction with solid surfaces has suggested that it is possible to create a single dot with a sidewall geometry very close to vertical. The drop spacing and the solidification state of the previous drop, coupled with the impact velocity of the drop and the ink viscosity, affect the rate of coalescence to form a line. In order for the line to have a vertical sidewall profile it is essential that the coalescence process occurs in the time it takes for the drop material to spread-out to the width of the solidified drop (i.e., in a time $\leq$ to 10 $\mu$seconds).

An ion implantation mask may be formed (see FIG. 25). The objective of the masking material is to shield the surface under the mask from a high energy ion beam. The energy range of interest spans 10 eV to 50 MeV. The masking layer thickness will depend upon the energy of the irradiating beam. For the highest energy the anticipated mask thickness will be $\leq 10$ $\mu$m.

The present invention may extend to a method of producing a surface relief pattern on a surface. Such a relief pattern could be a confinement well mask used in the manufacture of a single or multiple colour light-emitting polymer displays (see FIG. 26). Other such display devices that could make use of such a containment well include inorganic lanthanide dyes or organic small molecule dye structures.

The present invention may also extend to a method of producing a stand-off spacer pattern (see FIG. 27). The stand-off spacer being used to separate, by a known and precise height, two parts of a flat panel display device. An example is the use of a spacer material, of a known conductivity and secondary electron emissivity, for use in a vacuum-based field emission display. A further example is the separation well structure used in a liquid crystal display. The well structure contains the liquid crystal that can be either ink jet printed or vacuum impregnated in order to effect filling of the well.

In alternative arrangements, an etch mask may be formed using an all-dry, charged toner, photo-transfer process. This is an adaptation of photocopying in that the toner is a nano- or microcapsule/particulate/bead system that provides the necessary dimension and material properties for charge accumulation on the toner and particle transfer to the photoconductor and substrate to be patterned. A computer generated image (CGI) is fed to a light emitting polymer (LEP) display that irradiates, at a specific wavelength or waveband, the photoconductive (photoreceptor) drum/plate containing the electrostatic charge. As in a standard photocopier the electrostatic charge (positive) retained on the photoconductive drum/plate fades where light from the LEP display is incident. A roller system transfers toner (negatively charged) to the image area on the photoconductive drum/plate. A substrate is brought into close proximity and the toner is transfer from the photoconductive drum/plate to the substrate. The substrate has been given a sufficient strong positive static charge to draw the image pattern in the toner away from the photoconductive drum/plate and to provide sufficient electrostatic attraction to hold the toner in place. At this point the standard photocopier process can be continued, namely toner fusing to substrate via heated roller pressure. Alternatively, the toner can be processed using in-situ rapid thermal/infrared radiation (pulsed or continuous irradiation) processing means to reflow the microcapsules/particles/beads in order to effect material coalescence. By way of example, consider that the toner microcapsules/particles are in fact solid beads of a low temperature (<200° C.) thermoplastic. The charged particles undergo melting as the temperature is introduced. The degree of melting being sufficient to permit coalescence without excessive surface wetting (reflow). Removal of heat permits the thermoplastic to resolidify, thus forming the required etch mask pattern. It is anticipated that hollow capsules could be used that contain a specific material (i.e., polymer, inorganic, etc.). Upon exposure to the correct radiation/processing atmosphere the shell of the microcapsule will disintegrate revealing the material inside. This material, having controlled viscosity and surface tension (temperature dependent), flows out of the corrupted containment shell and coalesces with material from nearest neighbour capsules, thus forming the necessary patterned image. Such an image need not be limited to an etch mask pattern but could form part of an organic electronic or opto-electronic device. The CGI pattern transfer means that no masks are required for this process.

Some examples embodying the present invention will now be described.

General Features

1. Interlacing of images and printhead addressability

The circuit image is generated on a CAD/CAM system and exported to the mask print system in a standard vector format, such as RS-274X gerber. The file containing the circuit image is then converted to a raster format in order to produce the correct file type for printhead operation.

The raster image is also divided into swathes of an equal or lesser width to the printhead ready for printing. The image is further divided into a number of additional interlaced passes within each swathe in order to generate greater image resolution.

Channel stepping is an important issue in the field of etch mask printing as it allows increased addressability of drops onto the substrate than that produced using the printhead in its standard configuration.

The printhead is indexed by a value equal to

1/number of passes x the nozzle spacing

For example in the case of a printhead with a nozzle resolution of 180 dpi, an image resolution of 360 dpi may be achieved by using 2 passes within each swathe with a ½ channel (70.5 micron) channel step incorporated. The image will be different for each pass within the swathe, in the case of 2 passes each pass image will contain alternate pixel lines.

For a 720 dpi drop addressability on the substrate 4 (that is, 720/180) passes are required, so that for a 720 dpi substrate addressability the printhead step index is ¼×141.1 microns=35.275 microns In the case of a 4 pass process each successive image pass will contain every $4^{th}$ pixel line.

It is envisaged that future printhead developments may give 16 level greyscale with smaller drops and 360 dpi nozzle density. In this instance for 2880 dpi drop addressability on the substrate, 8 (that is, 2880/260) passes are required. For this 2880 dpi substrate addressability, the printhead step index is: ⅛×70.6 microns=8.82 microns An addition to this interlacing process is that subsequent passes within a swathe are carried out using a different set of nozzles. For example when using a 500 nozzle printhead then the image is divided into swathes/passes of between 400 and 496 pixel lines. The printhead may then moved by a whole number as well as the fractional step between channels, with the image adjusted in software to realign the image correctly. This approach minimises the impact of nozzle variations or failures, reducing pinhole formation and open circuit failure rates in the circuit produced.

For example the printhead may be indexed by 5¼x nozzle spacings between passes with the printhead channel offset parameter increased by 5 in order to realign the image.

2. General copper laminate pretreatment

All types of copper laminates, for example, standard HTE, reverse treated, double treated, chromate treated on both FR4 and PET substrates are subjected to the particular pretreatment regimes. A persulfate microetch is used to remove the anti-oxidant layer. Alternatively, pumicing, brushing or polishing the surface can also give satisfactory results. The surface roughness is typically in the range 0.1–5.0 microns, preferably 0.1–1.0 microns.

A proprietory anti-tarnish spray along with an adhesion promoter is then sprayed onto the board. The surface energy of the pretreated boards is within the range 24–35 dynes/cm, preferably 26–28 dynes/cm. Finally, a tacky roller or ioniser is used to remove any dust specks from the pretreated boards before printing.

3. General conditions

Etch mask printing has been carried out in a dust and vibration free environment, at ambient temperatures in the range of 10–40° C., preferably 20–30° C. at an ambient humidity which is preferably between 20 and 70%. The printhead temperature for all of the examples was in the range 30–60° C., preferably 35–45° C.

EXAMPLE 1

Large Feature Sizes

The large feature size work (over 250 microns) was carried out using a Xaarjet XJ500 180 dpi printhead, designed to print UV curing acrylate based fluids, and constructed to a nozzle stagger of between 15 and 47 microns. The stagger used in this example was 23.5 microns. This printhead had 500 nozzles and produced dropsizes of volume 70 pL. The printhead was used at a height of 0.5–2.0 mm above the substrate, preferably a height of 0.75–1.25 mm was used. The printhead addressability was in the range 180–540 dpi, preferably 360 dpi, and printing performed in two directions at a printing speed of 168–506 mm/s, preferably 282 mm/s. The drop impact/UV local cure delay was in the range 10–2000 ms, preferably 50–300 ms.

EXAMPLE 2

Medium Feature Sizes

The medium feature size work (over 150 microns) was carried out using a Xaarjet XJ500 360 dpi printhead, designed to print UV curing acrylate based fluids, and having a nozzle stagger of between 6 and 23.5 microns, preferably 11.8 microns. This head has 500 nozzles and produces dropsizes of volume 21 pico liters. The printhead was used at a height of above the substrate, preferably 0.75–1.25 mm The printhead addressability was in the range 360–1440 dpi, preferably 720 dpi and printing conducted in 4 passes in one direction at a printing speed of 60–506 mm/s, preferably 60–282 mm/s. The drop impact/UV local cure delay was in the range 10–2000 ms, preferably 50–300 ms.

EXAMPLE 3

Small Feature Sizes

The small feature size work (over 50 microns) was carried out using a Xaarjet XJ500 Greyscale (8 levels) printhead, designed to print UV curing acrylate based fluids, with a nozzle stagger of between 3 and 11.8 microns, preferably 6.0 microns. This head has 500 nozzles and produces dropsizes of between 5 and 6 pico liters per level. The printhead was used at a height of 0.5–2.0 mm above the substrate, preferably 0.25–1.25 mm. The printhead addressability was in the range 360–1440 dpi, preferably 720–1440 dpi and printing conducted in 4–8 passes, relative to the number of printheads used, in both directions at a printing speed of 43–350 mm/s, preferably 87.5–175 mm/s. The drop impact/UV local cure delay was in the range 10–2000 ms, preferably 50–300 ms.

It is envisaged that future printhead development providing 16 levels of greyscale with smaller dropsizes and increased nozzle density to 360 dpi, will enable the addressability range range to extend to 2880 dpi, with a print speed limited to the firing frequency of the printhead. Printing will be in the forward and reverse directions with 8 print passes (divided by the number of printheads used).

4. General UV ink curing conditions

The ink jet etch masking system is configured with two distinct UV curing sources: (i) a local curing source close to the printhead, with intensity in the range of 1–300 mW/$^2$; and (ii) a final, full board curing source of intensity between 100–300 W/linear inch, with a total energy of between 0.5 and 4 J/cm$^2$, and preferably 1–2 J/cm$^2$.

Curing is preferentially conducted under a partially oxygen reduced atmosphere, normally, but not limited to, a positive pressure of nitrogen or other inert gas in the curing areas. The residence time under the final UV cure is between 1 and 10 s.

Alternatively, local curing may be achieved using a xenon lamp with variable duty cycle, operating frequency and spectrum (using filters and/or doping of lamp gases and/or varying power supply to lamp).

5. Etch and mask pattern stripping conditions

The copper laminate board with the completed mask pattern is processed through a standard spray conveyor etch system using either acidic or alkaline etch chemistry.

The etch mask is then removed using an alkaline dip, preferably a caustic solution of potassium or sodium hydroxide/2-aminoethanol system at a temperature of between 20 and 50° C., and with agitation such as spray immersion.

It will be understood that the present invention has been described above purely by way of example, and modifications of detail can be made within the scope of the invention.

Each feature disclosed in the description, and (where appropriate) the claims and drawings may be provided independently or in any appropriate combination.

What is claimed is:

1. A method of forming a masking pattern on a surface, said method comprising the steps of:

using the technique of drop-on-demand printing to deposit from droplet deposition apparatus a plurality of droplets of deposition material on to a surface to, said droplets passing through an operating zone located between the deposition apparatus and the surface, and said droplets being deposited so as to enable coalescence of one such droplet with at least one other such droplet on said surface, and thus to form said masking pattern;

generating electromagnetic radiation; and exposing said deposition material to said electromagnetic radiation in the operating zone, wherein said electromagnetic radiation is generated in such a way as to change a fluid property of said deposition material so as to control said coalescence and thus to control the solidity of the masking pattern.

2. A method according to claim 1, wherein the formation of the masking pattern is controlled so that the masking pattern has predetermined structural properties.

3. A method according to claim 1, wherein the operating zone extends from the deposition apparatus to the surface.

4. A method according to claim 1, wherein relative movement is effected between the deposition apparatus and the surface so as to move said operating zone across the surface during formation of the masking pattern.

5. A method according to claim 1, wherein the local environment of the operating zone is controlled so as to control the coalescence of the droplets on the surface.

6. A method according to claim 1, wherein the local environment of the operating zone is controlled so as to control the spreading of the droplets on the surface.

7. A method according to claim 1, wherein the local environment of the operating zone is controlled so as to control placement of the droplets on the surface.

8. A method according to claim 1, wherein the local temperature of the operating zone is controlled so as to control the rate of solidification of the droplets on the surface.

9. A method according to claim 1, wherein the local atmosphere of the operating zone is controlled.

10. A method according to claim 9, wherein an at least partial vacuum is generated in the operating zone so as to substantially avoid contamination of the droplets during passage from the deposition apparatus to the surface.

11. A method according to claim 9, wherein a pressure differential extending between the deposition apparatus and the surface is established in the operating zone.

12. A method according to claim 9, wherein an inert or reactive gas is introduced into the operating zone during droplet deposition.

13. A method according to claim 1, wherein the duration of the local exposure of the operating zone to electromagnetic radiation is controlled so as to control the spreading of the droplets on the surface, thereby controlling the resultant shape of the masking pattern.

14. A method according to claim 1, wherein the intensity of electromagnetic radiation is controlled so as to control the spreading of the droplets on the surface, thereby controlling the resultant shape of the masking pattern.

15. A method according to claim 1, wherein the operating zone extends to the surface, and local exposure of the operating zone to electromagnetic radiation is carried out subsequent to the deposition of droplets passing through the operating zone.

16. A method according to claim 15, wherein the time period between the deposition of droplets on the surface and said local exposure is controlled so as to control spreading of the droplets on the surface.

17. A method according to claim 16, wherein said time period is in the range from 1 to 2000 ms.

18. A method according to claim 17, wherein said time period is in the range from 50 to 300 ms.

19. A method according to claim 1, wherein said electromagnetic radiation is emitted from a source integral with said deposition apparatus.

20. A method according to claim 19, wherein said electromagnetic radiation is emitted from a plurality of sources spaced along the deposition apparatus.

21. A method according to claim 1, wherein the electromagnetic radiation comprises at least one of ultra violet, visible light, infra red, and microwaves.

22. A method according to claim 1, wherein multiple wavelengths of electromagnetic radiation are co-incident sequentially or in parallel on the deposited droplets.

23. A method according to claim 1, wherein the electromagnetic radiation is emitted from at least one light emitting diode.

24. A method according to claim 23, wherein the electromagnetic radiation is emitted from an independently addressable array of light emitting diodes.

25. A method according to claim 1, wherein the electromagnetic radiation is emitted from a semiconductor quantum-well solid state laser.

26. A method according to claim 25, wherein the electromagnetic radiation is emitted from an independently addressable array of semiconductor quantum-well solid state lasers.

27. A method according to claim 1, wherein the electromagnetic radiation is emitted from at least one light emitting polymer.

28. A method according to claim 27, wherein the electromagnetic radiation emitted from said light emitting polymer is filtered to select a particular wavelength of electromagnetic radiation.

29. A method according to claim 1, wherein the electromagnetic radiation is emitted from a microwave initiated gaseous discharge radiation source.

30. A method according to claim 1, wherein the electromagnetic radiation is emitted from a plurality of optical fibres.

31. A method according to claim 1, wherein the electromagnetic radiation emitted is focused on the droplets.

32. A method according to claim 1, wherein, subsequent to the local exposure of the operating zone to electromagnetic radiation, the deposited masking pattern is fully exposed to electromagnetic radiation so as to ensure that the deposited droplets are cured.

33. A method according to claim 1, wherein the distance between the deposition apparatus and the surface is controlled during droplet deposition so as to control the time taken for a droplet to pass from the deposition apparatus on to the surface.

34. A method according to claim 33, wherein said distance is in the range from 0.5 to 2 mm.

35. A method according to claim 34, wherein said distance is in the range from 0.75 to 1.25 mm.

36. A method according to claim 1, wherein the deposited masking pattern is imaged using imaging apparatus integral with the deposition apparatus.

37. A method according to claim 1, comprising the step of controlling the surface energy of the surface prior to droplet deposition.

38. A method according to claim 37, wherein the surface is subjected to at least one of abrasion, polishing, ozone treatment, plasma exposure and surface coating prior to droplet deposition.

39. A method according to claim 1, wherein the droplets are deposited from a droplet deposition printhead comprising a deposition chamber for housing said deposition material, an outlet nozzle in fluid communication with said deposition chamber, and means for ejecting droplets of deposition material from said deposition chamber through said outlet nozzle.

40. A method according to claim 39, wherein the droplets are deposited from a plurality of said printheads.

41. A method according to claim 40, wherein the masking pattern is formed from a plurality of deposition materials, each deposition material being deposited from respective deposition printhead.

42. A method according to claim 39, wherein the outlet nozzle is selectively covered to substantially prevent entry of electromagnetic radiation into the deposition printhead.

43. A method according to claim 39, wherein said nozzle is cleaned after ejection of a droplet from said deposition chamber.

44. A method according to claim 39, wherein said outlet nozzle is selectively covered by a nozzle shutter, said shutter comprising means for cleaning said nozzle.

45. A method according to claim 44, wherein said outlet nozzle is cleaned by a movable wiper blade attached to said nozzle shutter.

46. A method according to claim 44, wherein residual deposition material removed from said nozzle by said cleaning means is transferred to a reservoir housed with said deposition printhead.

47. A method according to claim 1, wherein the surface is disposed on a flexible sheet connected between two reels, said reels being rotated to move the surface relative to the deposition apparatus.

48. A method according to claim 1, comprising the step of at least partially removing said deposited masking pattern.

49. A method according to claim 1, wherein said masking pattern is a three-dimensional masking pattern.

50. A method according to claim 49, wherein said masking pattern comprises a plurality of layers of deposition material, said layers being sequentially deposited on said surface.

51. A method according to claim 50, wherein each layer has a respective shape.

52. A method according to claim 49, wherein said masking pattern is formed from a multiplicity of droplets deposited at a plurality of deposition sites on the surface, droplets being deposited at each of said sites in turn.

53. A method according to claim 1, wherein said masking pattern comprises a solder reflow mask.

54. A method according to claim 53, wherein said mask is formed from one of silicone, polyimide, polytetrafluoroethylene and epoxy.

55. A method according to claim 1, wherein said masking pattern is an etching mask.

56. A method according to claim 55, wherein said etching mask is formed from an organic-inorganic fluid.

57. A method according to claim 55, wherein said etching mask is formed from one of epoxy, polycarbonate, silicon, polytetrafluoroethylene, polychlorotrifluoroethylene, polyimide, polyisoprene and polypropylenepolystyrene.

58. A method according to claim 1, wherein said masking pattern is an electrically conductive mask.

59. A method according to claim 58, wherein said mask is formed from one of carbon-based and metal acetate-based material.

60. A method according to claim 1, wherein said masking pattern is a decorative masking pattern.

61. A method according to claim 1, wherein said masking pattern is an ion implantation mask.

62. A method according to claim 1, wherein said masking pattern is a confinement well mask.

63. A method according to claim 1, wherein said fluid property comprises at least one or rheology, chemical cross-linking, and viscosity.

64. A method according to claim 1, wherein said exposure to electromagnetic radiation occurs at least partially in-flight.

65. A method according to claim 1, wherein spreading of said deposition material on the surface is arrested within about 1 millisecond of deposition on said surface.

66. A method according to claim 1, wherein said coalescence occurs within 10 microseconds of deposition of said one such droplet.

67. A method according to claim 19, wherein said electromagnetic radiation is emitted from a source integrated with a printhead.

68. A method according to claim 25, wherein said laser is integrated with a printhead.

69. A method of forming a spacer pattern on a surface, said method comprising the steps of:
using the technique of drop-on-demand printing to deposit from droplet deposition apparatus a plurality of droplets of deposition material on to a surface, said droplets passing though an operating zone located between the deposition apparatus and the surface, and said droplets being deposited so as to enable coalescence of one such droplet with at least one other such droplet on said surface, and thus to form said spacer pattern;
generating electromagnetic radiation; and
locally exposing said deposition material to said electromagnetic radiation so in the operating zone,
wherein said electromagnetic radiation is generated in such a way as to change a fluid progeny of said deposition material so as to control said coalescence and thus to control the solidity of the spacer pattern.

70. A method of forming a circuit pattern on a circuit board, said method comprising the steps of:
using the technique of drop-on-demand printing to deposit from droplet deposition apparatus a plurality of droplets of deposition material on to said circuit board to at least partially fill via holes formed in the circuit board, said droplets passing through an operating zone located between the deposition apparatus and the surface, and said droplets being deposited so as to enable coalescence of one such droplet with at least one other such droplet, and thus to fill said via holes;
generating electromagnetic radiation; and
exposing said deposition material to said electromagnetic radiation in the operating zone,
wherein said electromagnetic radiation is generated in such a way as to change a fluid property of said deposition material so as to control said coalescence and thus so controlling the filling of the via holes.

71. A method of forming a relief pattern on a surface, said method comprising the steps of
selectively irradiating a charged roller to selectively remove the charge on portions of the roller;
using the technique of drop-on-demand printing to deposit from droplet deposition apparatus a plurality of droplets of deposition material on to the charged portions of the roller, said droplets passing through an operating zone located between the deposition apparatus and the roller, and said droplets being deposited so as to enable coalescence of one such droplet with at least one other such droplet on said charged portions of said roller;
generating electromagnetic radiation;
exposing said deposition material to said electromagnetic radiation in the operating zone; and
transferring the deposited material from the roller on to a surface to form a relief pattern on said surface,
wherein said electromagnetic radiation is generated in such a way as to change a fluid property of said deposition material so as to control said coalescence and thus to control the structure of the pattern formed on the roller.

72. A method according to claim 71, wherein the relief pattern formed on the surface is subsequently heated to effect material coalescence.

73. A method according to claim 71, wherein the relief pattern formed on the surface is subsequently subjected to radiation curing to effect material coalescence.

74. A method according to claim 71, wherein the relief pattern comprises an organic electrode.

75. A method according to claim 71, wherein said relief pattern comprises an opto-electronic device.

76. A method according to claim 71, wherein the relief pattern comprises a masking pattern.

77. A method of forming a circuit pattern on a circuit board, said method comprising the steps of:
using drop-on-demand printing to deposit from a droplet deposition apparatus at least one droplet of deposition material on to said circuit board to at least partially fill a via hole formed in the circuit board, said at least one droplet passing through an operating zone located between the deposition apparatus and the surface;
generating electromagnetic radiation; and
exposing said deposition material to said electromagnetic radiation in the operating zone,
wherein said electromagnetic radiation is generated in such a way as to change a fluid property of said deposition material so as to control surface tension of said at least one droplet on said circuit board and thus to control the filling of the via hole.

* * * * *